US006566745B1

(12) United States Patent
Beyne et al.

(10) Patent No.: US 6,566,745 B1
(45) Date of Patent: May 20, 2003

(54) IMAGE SENSOR BALL GRID ARRAY PACKAGE AND THE FABRICATION THEREOF

(75) Inventors: Eric Beyne, Leuven (BE); Steve Lerner, Overijse (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 09/538,385

(22) Filed: Mar. 29, 2000

Related U.S. Application Data
(60) Provisional application No. 60/126,980, filed on Mar. 29, 1999, and provisional application No. 60/126,737, filed on Mar. 29, 1999.

(51) Int. Cl.$^7$ .......................... H01L 23/02; H01L 23/48; H01L 23/52; H01L 23/28
(52) U.S. Cl. .................. 257/680; 257/431; 257/432; 257/433; 257/434; 257/704; 257/780; 257/784; 257/787; 257/778; 257/737
(58) Field of Search .................. 257/680, 787, 257/778, 780, 431–434, 704

(56) References Cited

U.S. PATENT DOCUMENTS

| 4,558,171 A | * 12/1985 | Gantley et al. | 174/52 |
| 4,894,707 A | * 1/1990 | Yamawaki et al. | 357/74 |
| 6,117,705 A | * 9/2000 | Glenn et al. | 438/106 |
| 6,130,448 A | * 10/2000 | Bauer et al. | 257/222 |
| 6,144,507 A | * 11/2000 | Hashimoto | 359/815 |
| 6,255,741 B1 | * 7/2001 | Yoshihara et al. | 257/792 |

FOREIGN PATENT DOCUMENTS

JP   PCT/JP97/02304   * 1/1998   ............ G02B/7/02

OTHER PUBLICATIONS

Abstract—Wu, et al, *Active Pixel Sensor (APS) Package*, 1999 International Conference on High Density Packaging and MCMs;Apr. 6–9, 1999, The Adam's Mark Hotel, Denver, Colorado; Sponsored by International Microelectronics and Packaging Society.

Abstract—Shweky, et al, *A CSP Optoelectronic Package for Imaging and Light Detection Applications*, 1998 International Symposium on Microelectronics; Nov. 1–4, 1998, San Diego Convention Center, San Diego, California, Sponsored by International Microelectronics and Packaging Society.

* cited by examiner

*Primary Examiner*—Tom Thomas
*Assistant Examiner*—Nitin Parekh
(74) *Attorney, Agent, or Firm*—Knobbe Martens Olson & Bear LLP

(57) ABSTRACT

The present invention is related to an image sensor packaging technique based on a Ball Grid Array (BGA) IC packaging technique, further referred to as image sensor ball grid array (ISBGA). A transparent cover is attached to a semiconductor substrate. Depending on the method of attaching the cover to the substrate a hermetic or non-hermitic sealing is obtained. The obtained structure can be connected trough wire-bonding or flip chip connection.

13 Claims, 21 Drawing Sheets

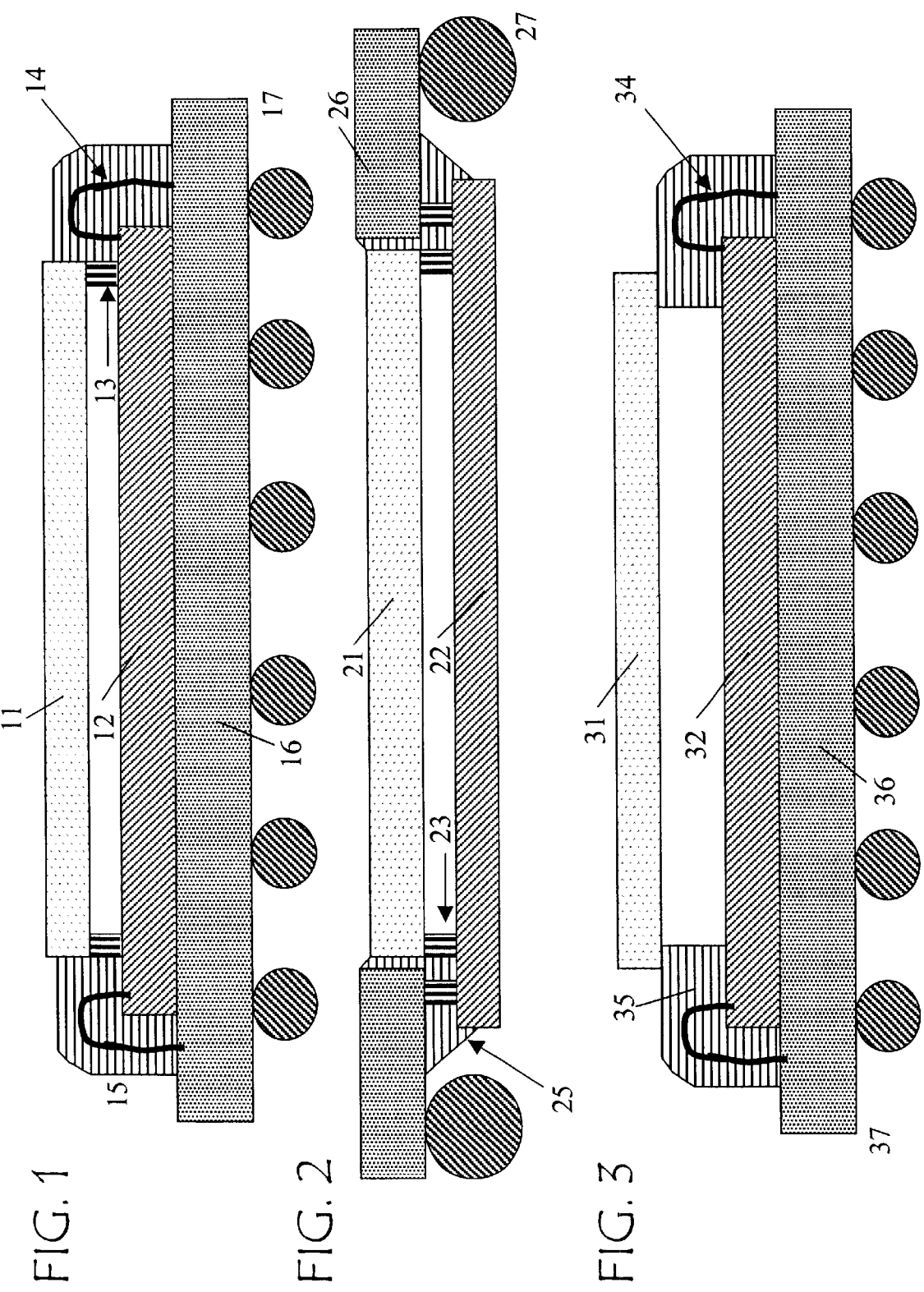

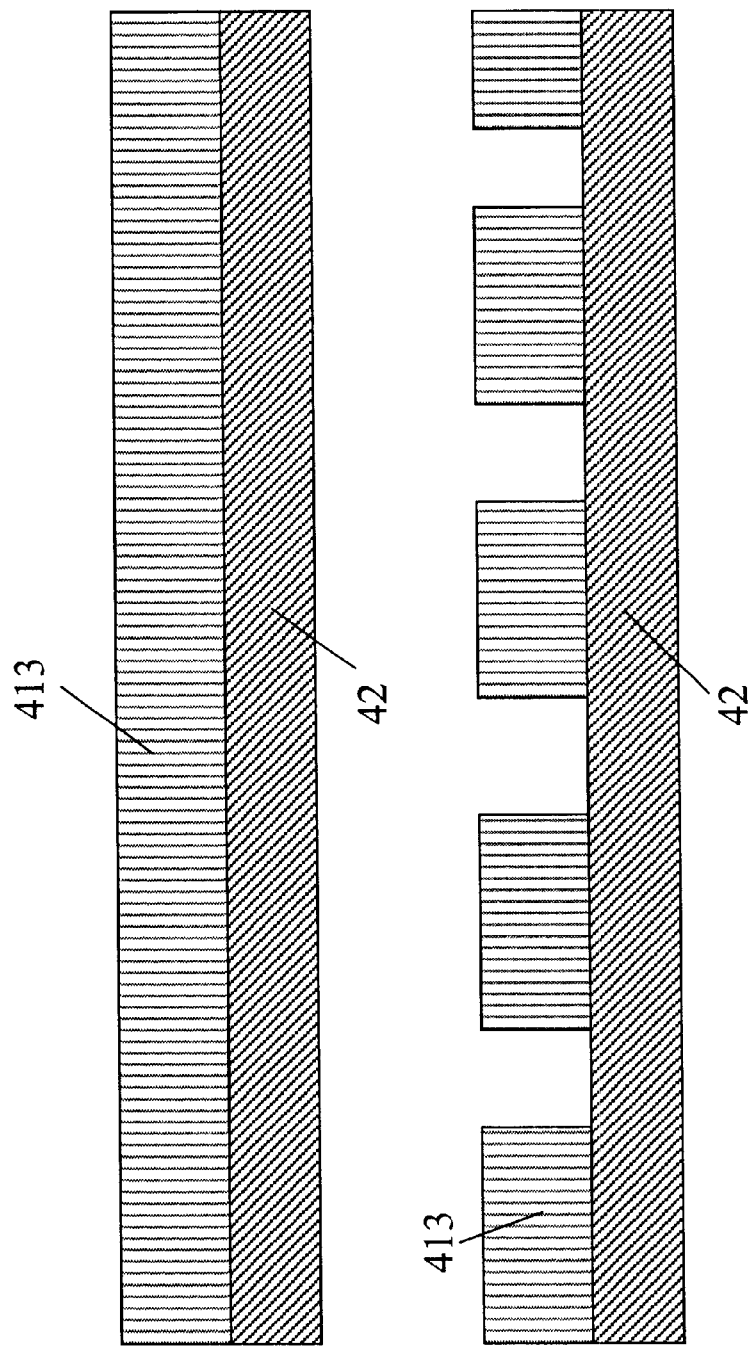

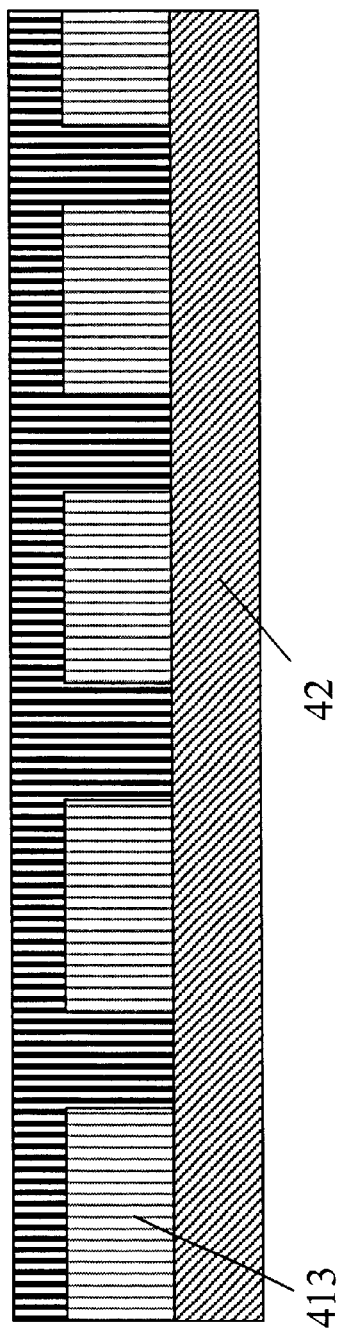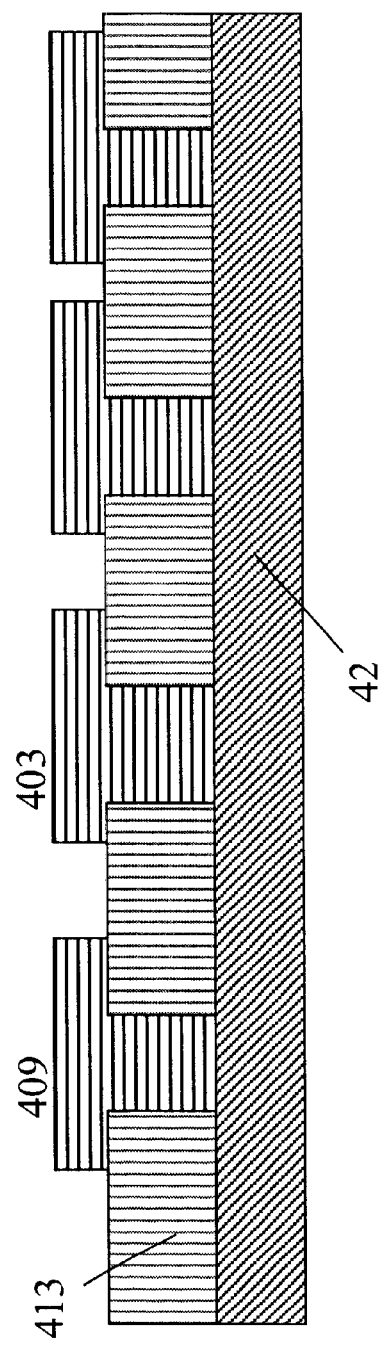
FIG. 4C
FIG. 4D

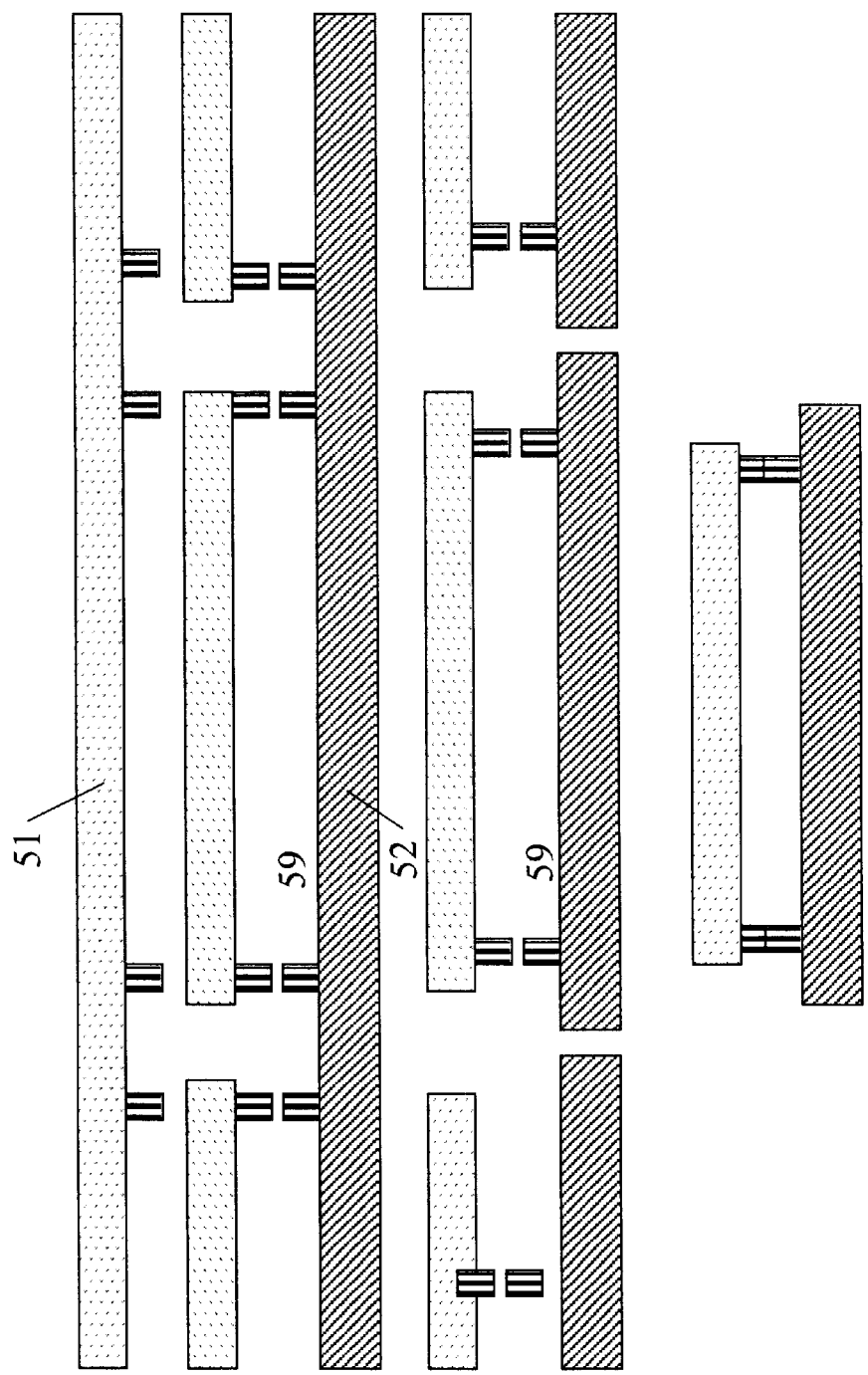

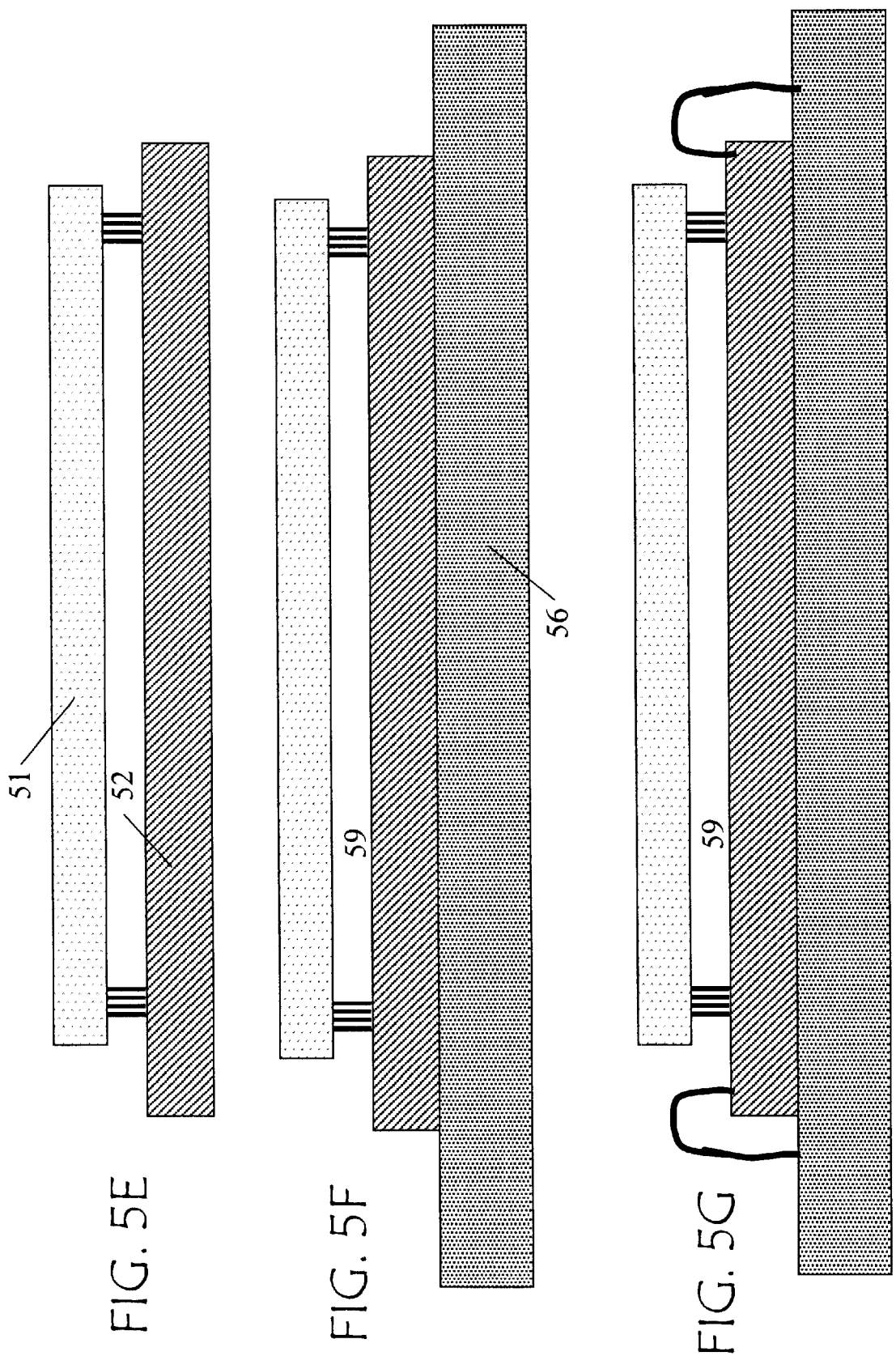

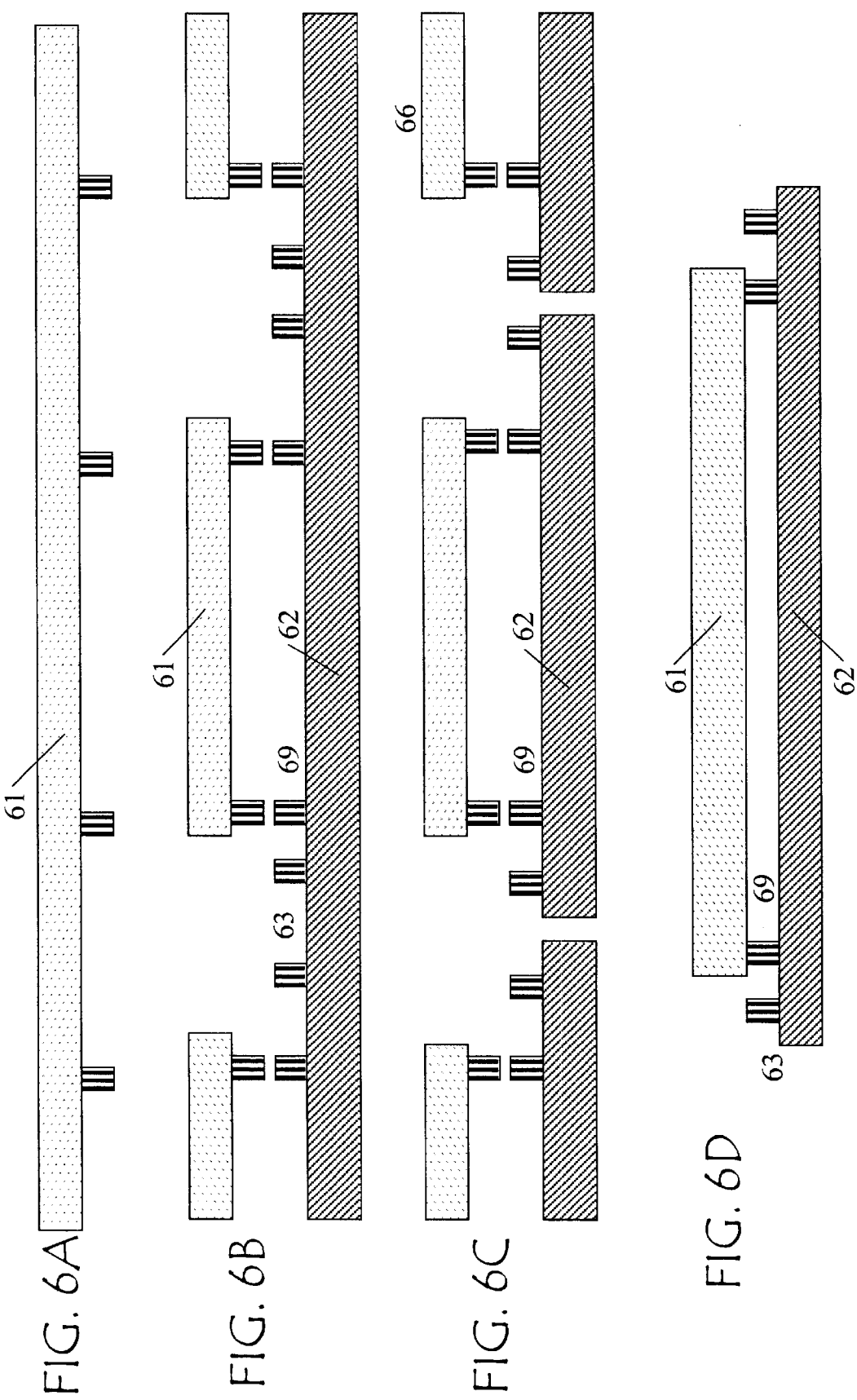

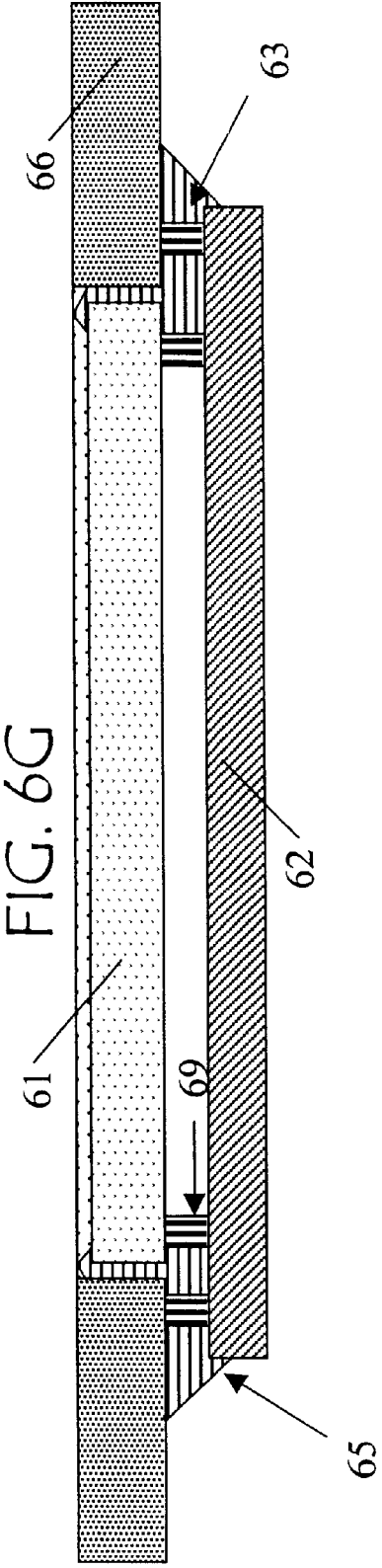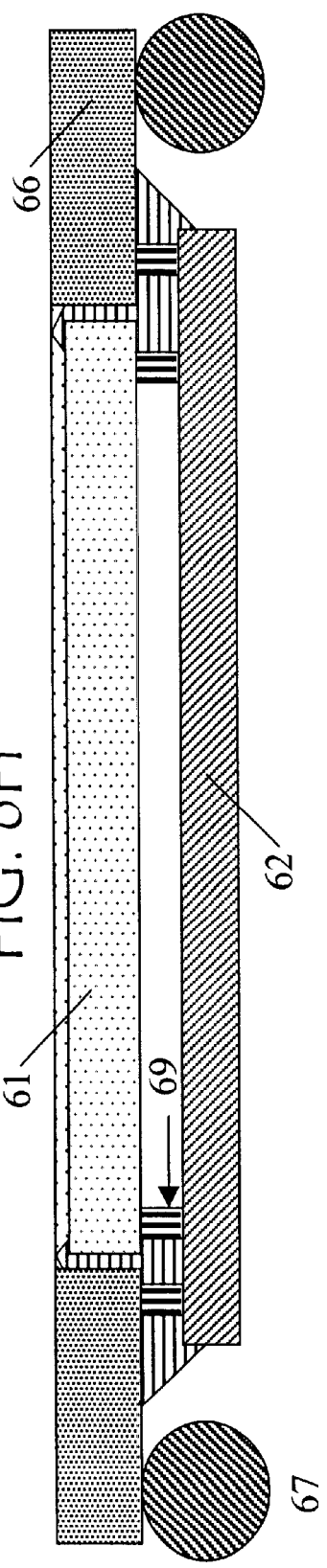

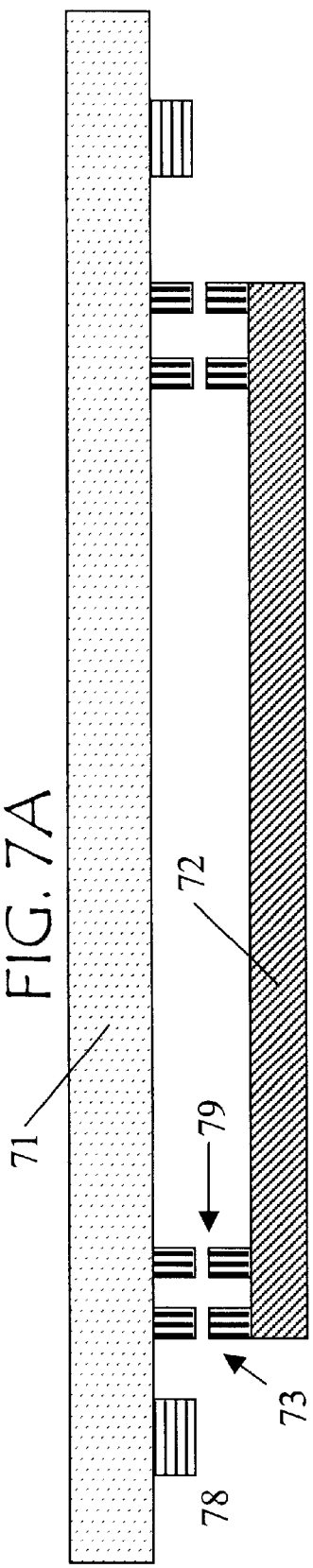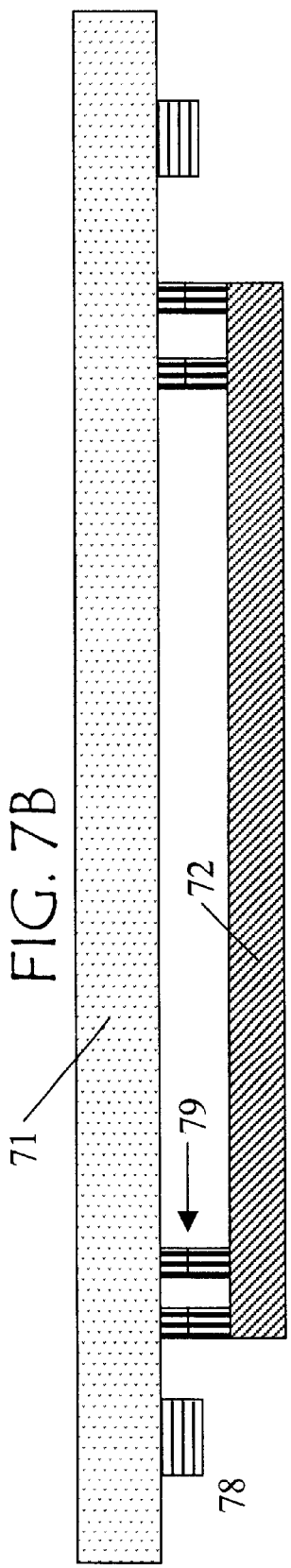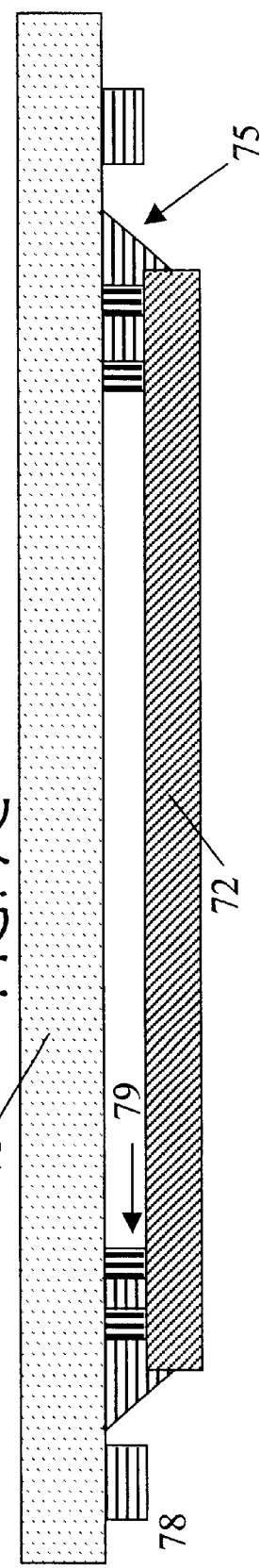

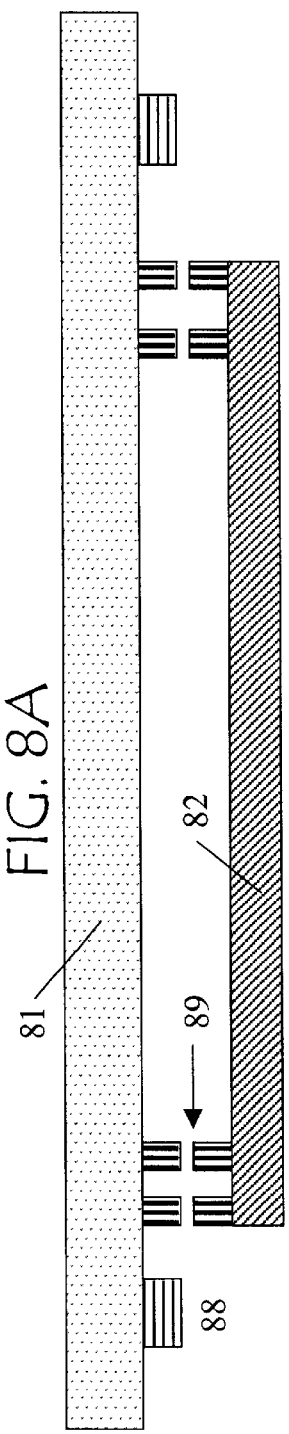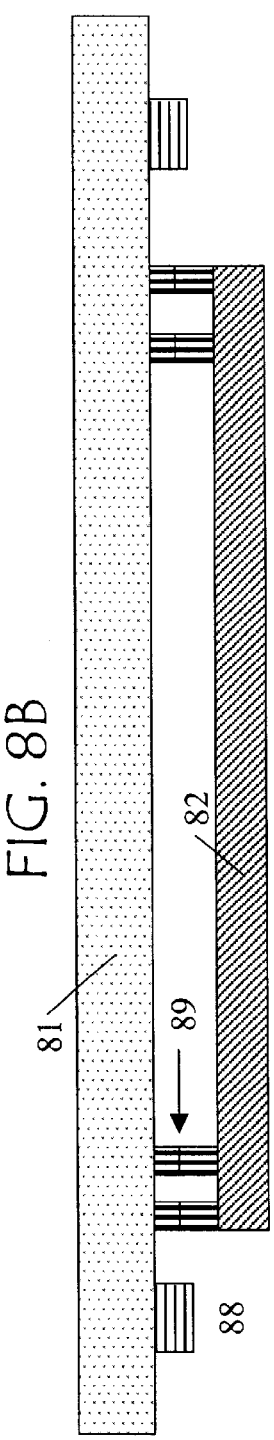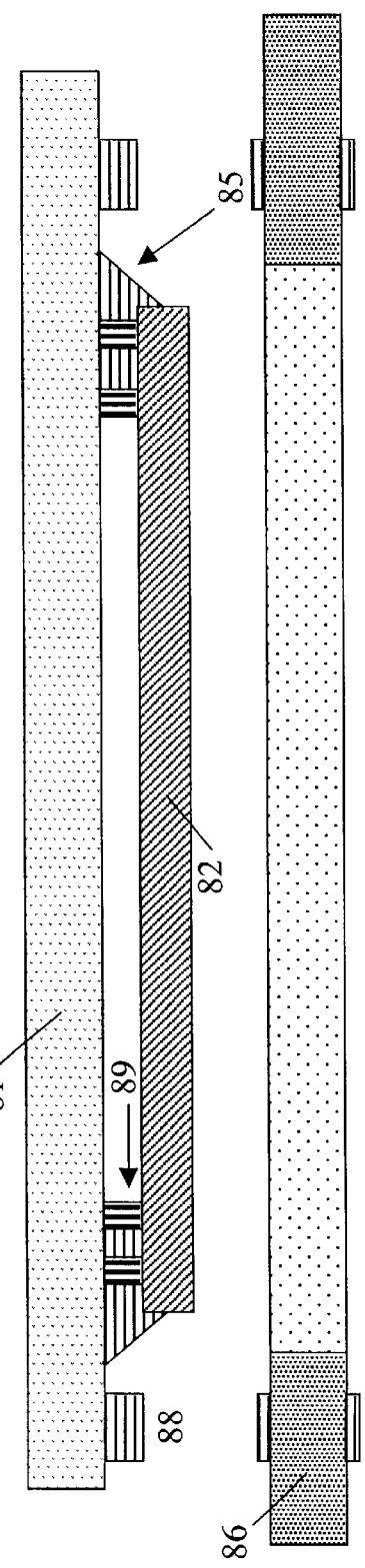

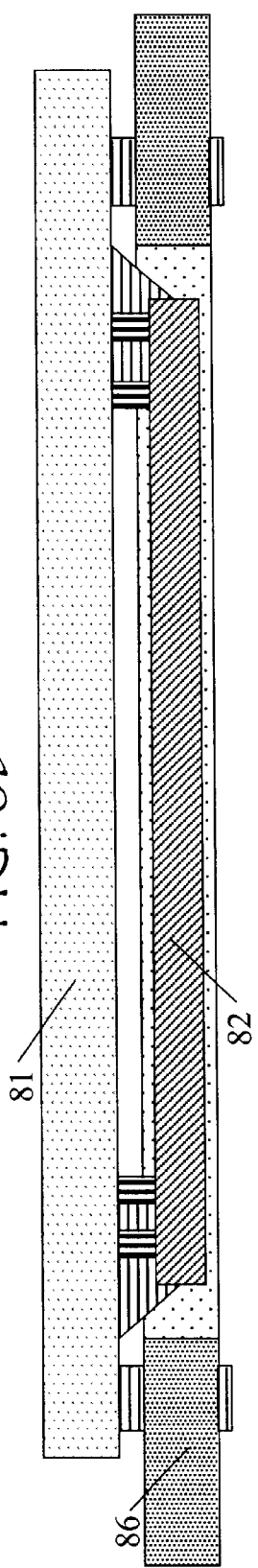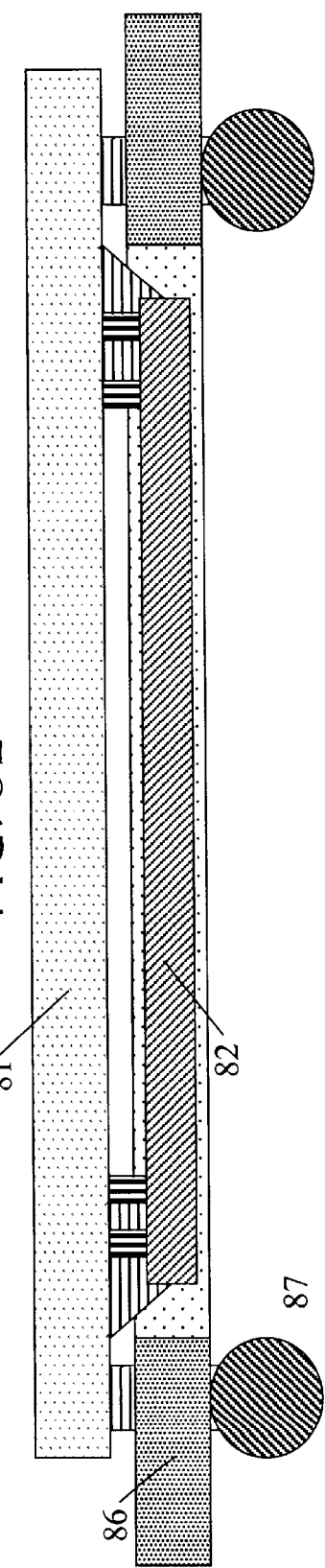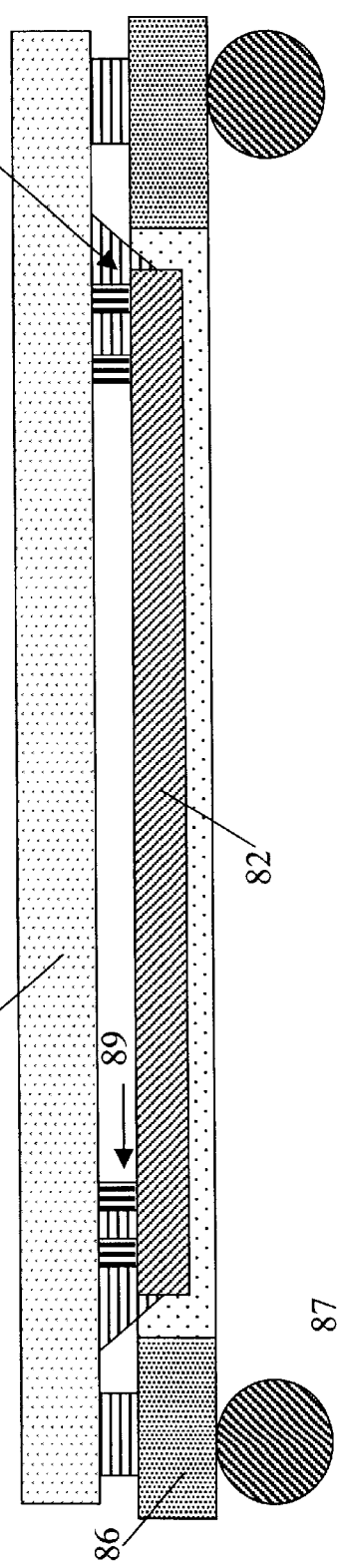

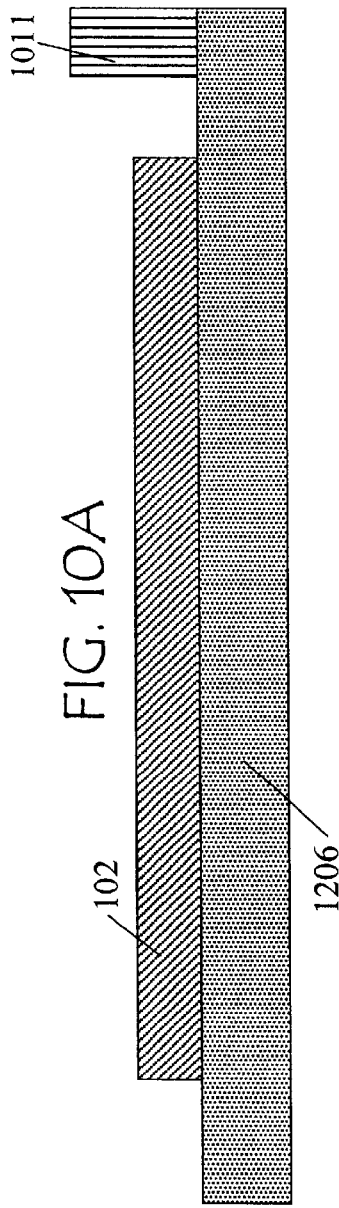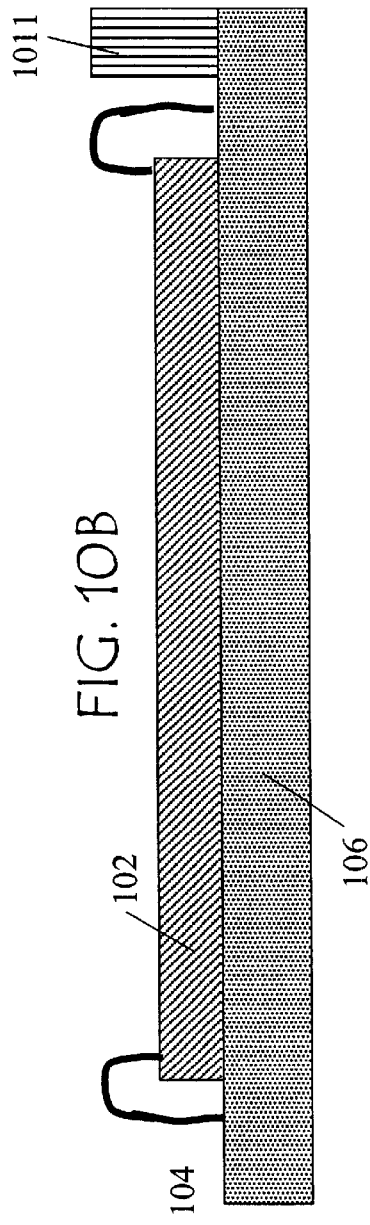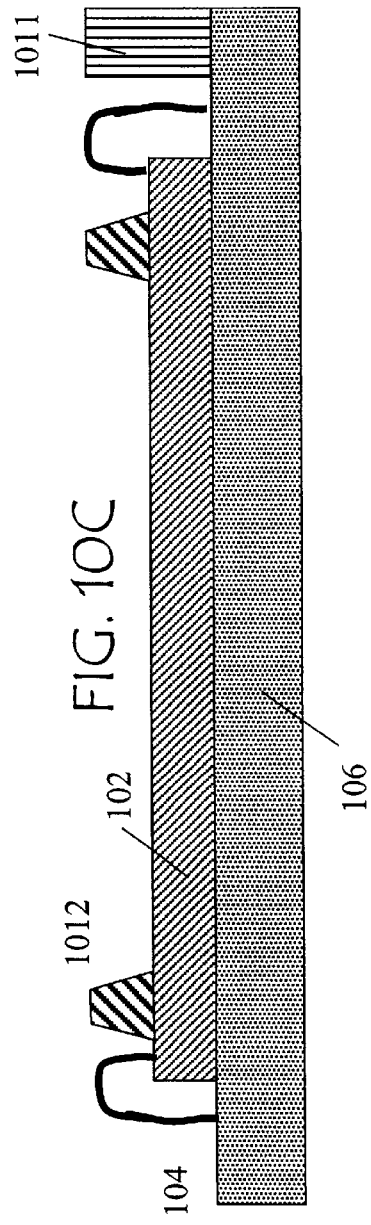

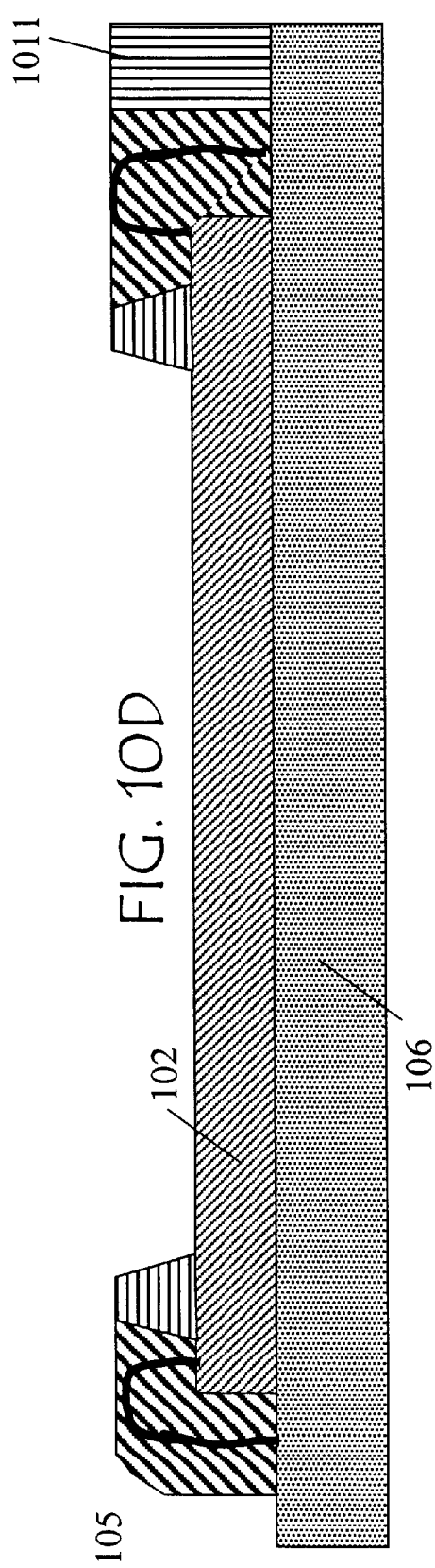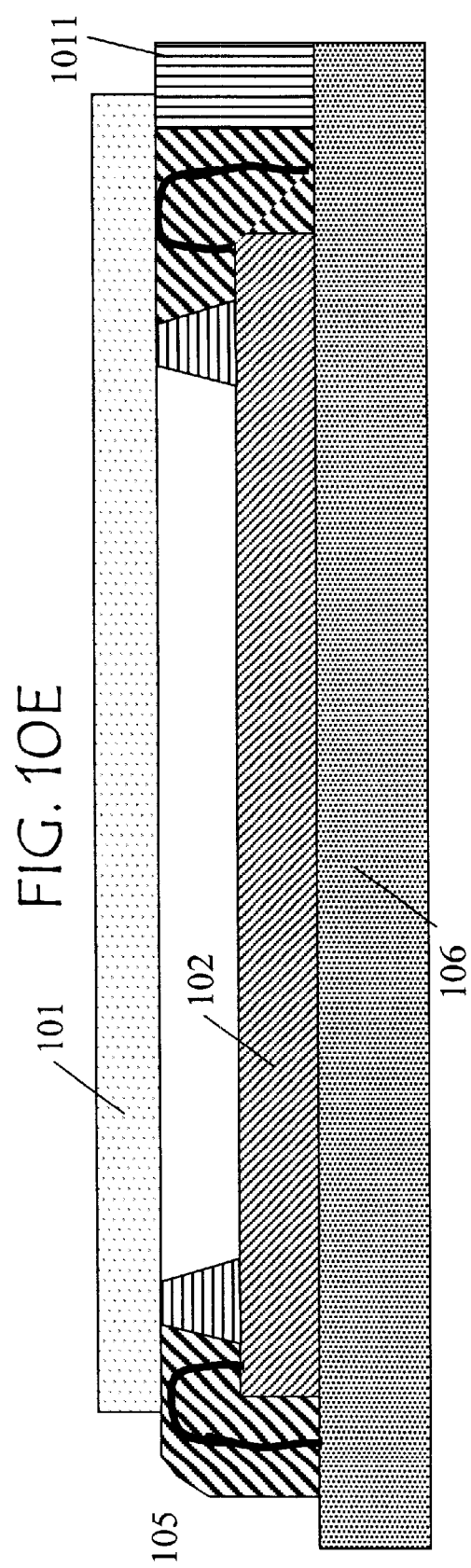

IMAGE SENSOR BALL GRID ARRAY
PACKAGE AND THE FABRICATION
THEREOF

RELATED APPLICATIONS

This application claims priority to U.S. Provisional Application No. 60/126,980, filed Mar. 29, 1999, and U.S. Provisional Application No. 60/126,731, filed Mar. 29 1999; each of which is hereby incorporated by reference.

FIELD OF THE INVENTION

The present invention is related to an image sensor packaging technique based on a Ball Grid Array (BGA) IC packaging technique, further referred to as image sensor ball grid array (ISBGA).

BACKGROUND OF THE INVENTION

Digital imaging is becoming a fast growing market, as digital sensors are being used in a variety of applications ranging from professional and personal photography, medical imaging, Internet, to video conferencing and even cellular mobile telephone telecommunication. As is the case for all consumer electronics also the digital imaging market is characterized by an ongoing reduction of costs combined with an increase in performance.

CMOS image sensors are expected to replace Charge Coupled Devices (CCD's) in the near future as the image sensor technology, particularly in low-cost image capture applications. Using CMOS based image sensor technology allows the integration of the image sensing part with the digital control and signal processing circuitry. This integration can even further reduce the cost of the overall digital imaging and processing circuitry leading to so-called optonic, i.e. opto-electronic devices. Low cost, standard packages are generally available, but these packages are not suitable as they lack a window through which the light or radiation can be sensed. Standard packages may also be too small to contain image sensors, as such sensors including the electronic circuitry can become very large. Custom made packages do allow for window covers, but they are typically too expensive. In view of this development, the packaging of such an image sensor has become an important issue, mainly due to the large contribution of the packaging cost in the overall cost of the image sensor fabrication.

In the article "Active Pixel Sensor (APS) package", published in the 1999 International conference on High Density Packaging and MCMs, an active pixel sensor package is disclosed. The singulated dies are placed in an array of, for example, ceramic land-grid-array (LGA) packages. The streets between the dies are filled with B-stage epoxy. On each die, a glass frame is attached using this epoxy. Afterwards the array of LGA-packages, containing the glass-covered chips, is sawed into single packages. This package however suffers from adhesion problems on MCM-boards. Also the array-wise packaged dies have characteristics different from dies packaged in an individual way.

In "A CSP optoelectronic Package for Imaging and Light detection applications", published by ShellCase, POB 48328, Jerusalem, Israel, an opto-electronic package is presented. A glass plate is attached to the front of the wafer using an optically clear epoxy adhesive. The back of the wafer is ground and etched to separate the dies. A second glass plate is attached to the back of the wafer using an intermediate epoxy layer. This epoxy layer also has to planarise the overall surfaces as, for example, the trenches in the back of the wafer which separate the dies. The bonding pads on the front side of the wafer are connected using a back-side metallization process. The full stack of glass plate, wafer, and backside metallization has then to be diced. Although a hermetic sealing of the device is obtained, the process requires a considerable amount of additional processing steps, such as grinding the backside of the wafer.

Aim of the Invention

An aim of the present invention is to fabricate an Image Sensor Ball Grid Array (ISGBA) package having the light sensitive part of the imager hermetically sealed from the environment. Ball grid array (BGA) packaging allows for packaging of highly functional devices with a large number of I/O's (inputs/outputs). This is combined with a true die size packaging, leading to a minimum footprint of the package. BGA packages can be produced in a more standard way. These packages are adapted in order to transmit the light or radiation to the sensor and to provide a hermetic sealing of the obtained cavity to prevent e.g. diffusion of moisture or epoxy in between the image sensor and the transparent cover. The image sensor can be connected to the BGA substrate using wire bonding or flip chip bonding.

Another aim of the invention is to fabricate an Image Sensor Ball Grid Array (ISGBA) having the light sensitive part of the imager non-hermetically sealed from the environment. These Non-hermetically sealed ISBGA's are further referred to as NHISBGA's. This non-hermetic sealing offers reliability at least similar to standard plastic packaged components, but is produced in a more cost-effective way compared to the ISGBA. The distance between the image sensor and the transparent cover is controlled, thereby avoiding e.g. the occurrence of Newton-ring effects between the transparent cover and the die.

SUMMARY OF THE INVENTION

The present invention may provide a Hermetically Sealed Ball Grid Array device, comprising a structure having a sealed cavity, wherein said cavity is defined by walls according to a closed geometric configuration between a first substrate and a second substrate;
said second substrate being transparent;
said first substrate being a semiconductor substrate containing at least one optically sensitive area;
said walls comprising a metal seal between the first and second substrate and said walls surrounding said at least one optically sensitive area. The metal seal may comprise a stack of layers including at least a first metallization layer, a reflowed solder layer, and a second metallization layer. The second substrate may be larger than said first substrate, in which case the solder balls may be attached to said second substrate.

The present invention may also provide a Sealed Ball Grid Array device comprising,
a first substrate, said first substrate being a semiconductor substrate containing at least one optically sensitive area;
a second transparent substrate sealingly attached to and covering said optically sensitive area of said first substrate;
said device further comprising a third substrate, said third substrate being attached to said device; and
said first substrate being electrically connected to said third substrate using wire bonding, said wire bonds being totally encapsulated by a polymer. The device may further comprise a cavity, said cavity being defined by walls between said first substrate and said second substrate, said walls being located around said at least one optically sensitive area. The walls may comprise a stack of layers comprising at least a polymeric dam or a metal seal. The dam may comprise a structure to control the distance between said first and said second substrate or a separate spacer may be provided to control the distance between said first and said second substrate. The second substrate may be sealingly attached to said first substrate using a glue layer, said glue layer and said second substrate covering said at least one optical sensitive area formed on said first substrate. Preferably, the glue layer is a photosensitive material, for example BCB.

The devices described above may be used in a CMOS imager device

The present invention also includes a method for fabricating a Hermetically Sealed Ball Grid Array device, comprising the steps of providing a first substrate;

said first substrate being a semiconductor substrate containing at least one optically sensitive area;

defining a pattern of solderable material for contact pads and sealing ring on said first substrate;

providing a second transparent substrate;

defining a pattern of solderable material for forming a sealing ring on said second transparent substrate; and assembling said second substrate to said first substrate by means of said sealing ring pattern. The method may further comprise the steps of:

dicing said second transparent substrate into individual transparent covers after defining the pattern of solderable material thereon;

using the individual covers in the assembly step;

dicing said first substrate into individual dies and packaging said individual dies into a Ball Grid Array package.

Alternatively, the method may further comprise the steps of:

dicing said first substrate after forming the pattern of solderable material thereon;

the step of defining the solderable material on said second substrate includes defining an interconnect pattern thereon;

the assembly step includes assembling said diced first substrate to said second substrate by means of said sealing ring pattern using a flip chip assembly technique;

underfilling of the gap between said diced first substrate, said second transparent substrate and said sealing ring; and attaching solder balls to said interconnect pattern on said second substrate; and dicing said second transparent substrate.

The attachment of the solder balls may further comprise the steps of dicing the second substrate;

attaching an interposer frame on said second substrate, said interposer frame containing a window in which said diced first substrate fits, and attaching the solder balls to said inter-poser frame and dicing of said interposer frame.

The present invention may provide a method for fabricating a Sealed Ball Grid Array device, comprising the steps of providing a first substrate;

said first substrate being a semiconductor substrate containing at least one optically sensitive area;

attaching said first substrate to a third substrate;

forming wire bonds between the bond pads of said first substrate to said BGA package;

depositing a dam on said first substrate at the inside of said wire bonds;

depositing a polymer over said wire bonds to completely encapsulate said the wire bonds, said dam preventing the flow of said polymer over said first substrate;

providing a second transparent substrate and attaching said second substrate to said polymer on said first substrate curing said polymer.

The present invention may also provide a method for fabricating a Sealed Ball Grid Array device, comprising the steps of providing a first substrate;

said first substrate being a semiconductor substrate containing at least one optically sensitive area;

coating a thin optical glue layer on said first substrate;

patterning said glue layer;

providing a second transparent substrate;

coating a thin optical glue layer on said second substrate;

patterning said glue layer;

attaching said second substrate to said first substrate;

dicing said first substrate; and packaging said diced first substrate into a Ball Grid Array package, said packaging comprising the steps of forming wire bonds between the bond pads of said diced first substrate to said Ball Grid Array package and depositing polymer over said wire bonds to completely encapsulate said the wire bonds.

The present invention will be described with reference to the following drawings.

BRIEF DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the present invention is not limited to the content of the given drawings.

FIG. 1: A schematic drawing of a cross-section through the HISBGA package using wire bonding, according to one embodiment of the invention is shown FIG. 2: A schematic drawing of a cross-section through the HISBGA package using flip chip bonding according to one embodiment of the invention is shown FIG. 3: A schematic drawing of a cross-section through the NHISBGA, according to one embodiment of the invention is presented, showing the glass window attached to the substrate using the glob top encapsulation, which is also used to protect the wire bonds according to one embodiment of the invention is shown FIG. 4: Schematic representation of wafer level thin film post processing of the semiconductor (42) substrate according to one embodiment of the invention shown

FIG. 8: Schematic representation of the semiconductor substrate (81) and transparent substrate (82) processing and assembling in case of a "wafer level" HISBGA, showing the glass window (81) directly attached on the CMOS chip (82) using a solder ring (89), resulting in a hermetic sealing. The solder balls (87) of the flip chip bonding are attached to the transparent substrate (81) using an interposer (86), resulting in a highly reliable board assembly.

DETAILED DESCRIPTION

Figure 5H:
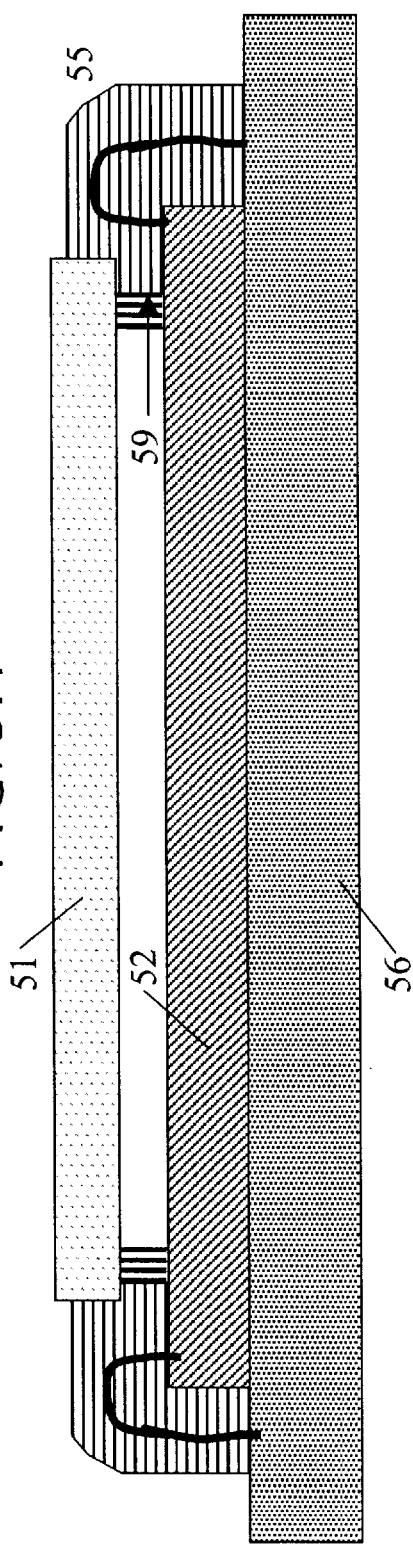
FIG. 5: Schematic representation of the semiconductor substrate (51) and transparent substrate (52) processing and BGA assembly of the chip with hermetic glass seal (59) using wire bonding technology and glob top encapsulation, according to one embodiment of the invention is shown
Figure 5I:
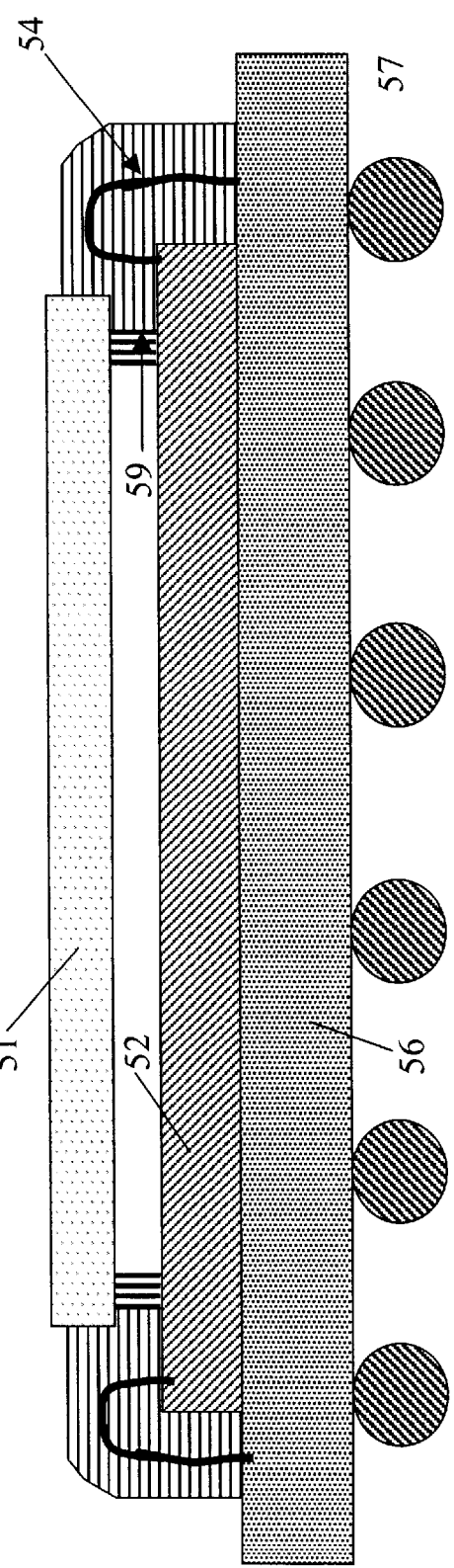

Fur the purpose of teaching of the present invention, preferred embodiments of the method are described in the sequel. It will however be apparent to the person skilled in the art that other alternative and equivalent embodiments of the invention or combinations thereof can be conceived and reduced to practice without departing from the true spirit of the invention as defined in the attached claims.

In a first aspect of the invention an Image Sensor Ball Grid Array (ISGBA) is presented having the light sensitive part of the imager hermetically sealed from the environment (e.g. FIGS. 1 and 2). These Hermetically sealed ISBGA's are further referred to as HISBGA's. Ball grid array (BGA) packaging allows for packaging of high functional devices with a large number of input/output pads (I/O's). This is combined with a true die size packaging, leading to a minimum footprint of the package. BGA packages can be produced in a more standard way. These packages can be adapted to include a transparent cover to transmit the light to the sensor and to provide a hermetic sealing of the thus obtained cavity to prevent e.g. diffusion of moisture or epoxy in between the image sensor and the transparent cover.

The HISBGA comprises a structure having a sealed cavity, wherein said cavity is defined by walls 13, 23 according to a closed geometric configuration between a first substrate 12, 22 and a second substrate 11, 21, said second substrate being transparent, said walls 13, 23 being a stack of layers comprising at least a first metallization layer, a reflowed solder layer, and a second metallization layer, and, said walls surrounding at least one optical sensitive area formed on said first substrate 12, 22. The HISBGA may further comprise an optional third substrate 16, for instance a BGA substrate, said third substrate being attached to said structure.

The starting point for this HISGBA package can be a standard Silicon wafer with imaging devices, a semiconductor substrate with imaging or radiation sensing devices, or a CMOS imager device with a specially adopted lay-out or similar. On these wafers, some thin film post processing is performed, mainly intended to define a solder or solderable metal ring surrounding the optical sensitive area or areas. Separately from this wafer, a glass wafer is processed with matching solder or solderable metal rings. The glass wafer is then diced, resulting in a single glass die that is slightly smaller than the CMOS die. The next step consists of soldering the glass die on the silicon wafer or semiconductor substrate, using a fluxless mass reflow soldering technique, creating a transparent cap above each die on the substrate. The glass cover only has to be parallel with the semiconductor substrate within one individual die, whereas an assembly of the glass wafer would require a planarity on wafer scale. After this step, the substrate or wafer is diced and the dies with transparent caps are individually attached to a BGA substrate by either wire bonding (FIG. 1) or flip chip solder connection (FIG. 2). The BGA substrate may be of different types, such as laminate boards, flex boards, molded metallised polymer packages, ceramic substrates, anodized metal packages, or similar. After chip attachment to the BGA substrate, a polymeric encapsulation step, e.g. a globtop (FIG. 1) or underfill epoxy (FIG. 2) is applied to protect and encapsulate the solder or wire bond connections. These materials also provide thermo-mechanical integrity to the package. The BGA package may then be completed, similar to common BGA-style packages, by attaching large solder balls 17, 27. These balls 17, 27 will form the connection to the next assembly level. In the following paragraphs a more detailed description of the process flow for the different embodiments will be given.

In case a standard silicon (Si) wafer or semiconductor substrate is used, the packaging procedure requires some wafer level thin film post processing. This post processing comprises the following steps (FIGS. 4A to D): Deposition of a dielectric layer (413) over the wafer or substrate (42). This layer may be an organic material layer with low moisture absorption, such as BenzoCycloButene (BCB) from Dow Chemical, USA or could also be an inorganic layer, such as a $Si_xO_xN_y$ layer. (FIG. 4A) These layers must be optically transparent. Forming contact openings in the dielectric layer 413 and opening of the wafer dicing streets. This may be performed by photo-definition, in case a photo-sensitive polymer is used, e.g. BCB, or may be performed by reactive ion etching, comprising the steps of lithographic patterning, etching and stripping of the resist. This step requires a first lithographic mask. (FIG. 4B) Deposition and patterning of a metal layer on the wafer (black layer in FIG. 4C). This metal layer will be the base for new contact pads for flip chip or wire bonding connections from the chip to the BGA substrate base, as well as for the solder sealing ring which results in the formation of a hermetic cavity. Two possible embodiments are:

a) Solderable and wire bondable metallisation: first a thin film metallisation such as Ti/Cu, typically 30 nm Ti/2000 nm Cu, is applied by sputtering. A photoresist mask layer is deposited by spin coating and then photo-patterned. The thin film metallurgy is wet etched, defining new IC-bond pads 403 and the metal sealing ring 409 around the optically active IC-area. This is the second mask layer for this process. Next, electroless Ni:P/Au plating, typically 5000 nm Ni:P/150 nm Au, is deposited on all exposed Cu surfaces. (FIG. 4 D)

b) Solder "bump" and "ring" metallisation: first a very thin film metallisation such as Ti/Cu, typically 30 nm Ti/100 nm Cu, is applied by sputtering. This layer is used as a plating base or "seed" layer for galvanic "pattern" plating of a copper and solder layer. The pattern to be plated is defined using a thick photoresist layer, deposited by spin coating. Using photo-definition, the pattern to be plated is realized as open areas in the thick resist. Next a solderable metal is plated, such as copper or nickel, typically 5000 nm thick. Directly following, a solder layer is plated on top of this base metal layer. The thickness of this solder layer may vary and can be higher than the photo-resist layer, given rise to a so-called "mushroom" shaped solder deposit. When a sufficient solder volume is plated, the resist layer is removed and the thin metal seed layer is etched back. Next the wafer is heated in a neutral ambient in order to melt the plated solder deposit. During cool down, the solder balls on the contact pads 403 and a solder sealing ring 409 are formed.

When an imager device has been specifically designed for this packaging method, the above process flow could be simplified to the processing of a single metal, directly on the aluminum metallisation of the die layer. This aluminum metallisation layer comprises a solderable metal layer or a solder bump and ring layer. Also here the solder balls on the contact pads 403 and a solder sealing ring 409 are formed.

Parallel to the post-processing of the wafer or imager device, the second, transparent, substrate is prepared. This process sequence can be as follows (FIGS. 5A to I). The starting point for fabricating the glass covers is a glass wafer or another transparent substrate 51, which may already have an optical coating on its surface. Such an optical coating can be a filter or anti-reflective coating, or a layer having the desired optical characteristics. More generally this transparent substrate is transparent towards the propagation of electromagnetic waves, preferably in the visible light range. On this glass wafer, a mirror image of the sealing ring 59 on the chip surface is fabricated (FIG. 5A). The same techniques may be used as for the silicon wafer, resulting in either a solder ring or a ring of solderable metal. Next, the individual glass covers are obtained by dicing of the glass wafer (FIG. 5B). The resulting glass dies are slightly larger than the seal ring pattern and smaller than the silicon chip in order to leave space for the wire bonding of flip-chip bonding on the chip I/O pads.

The next step in the fabrication process of the HISBGA is the assembly of the glass cover on the semiconductor wafer. The technique used for this process is based on the fluxless soldering of the sealing ring on the glass cover to the sealing ring on the die thereby forming a clean hermetic cavity between the glass or transparent cover and the optically active area of the die. This sequence is shown schematically in FIG. 5C.

After the above process steps of preparing the semiconductor substrate and the transparent substrate and the bonding of both substrates, the wafer is diced (FIGS. 5D, E) and the individual dies are packaged in a "standard" BGA-style. The structures formed are attached to a third substrate, i.e. the BGA substrate. Two different embodiments are described, using respectively wire bonding or flip chip bonding of the imaging device to the transparent cover.

In a first embodiment a Ball Grid Array packaging sequence is applied using wire bonding. This packaging sequence comprises the following packaging steps:

Die attach of the imaging device with transparent cap on the BGA substrate 56 (FIG. 5F)

Wire bonding 54 of the I/O connections from the chip 52 to the BGA substrate 56 is shown in FIG. 5G.

Glob top deposition 55 is preformed all over the wire bonds (FIG. 5H). This way the wire bonds are encapsulated, resulting in a higher strength against breaking of the wire bonds and leading to a more reliable packaged device.

Then solder balls 57 are attached to the BGA substrate 56 (FIG. 5I) followed by BGA substrate singulation.

In a second embodiment a Ball Grid Array packaging sequence is applied using flip chip bonding which will be described with reference to FIG. 6. In steps of FIGS. 6A to D, a glass wafer or another transparent substrate 61 is provided, which may already have an optical coating on its surface. Such an optical coating can be a filter or anti-reflective coating, or a layer having the desired optical characteristics. More generally this transparent substrate is transparent towards the propagation of electromagnetic waves, preferably in the visible light range. On this glass wafer, a mirror image of the sealing ring 59 on the chip surface is fabricated (FIG. 6A). The same techniques may be used as for the silicon wafer, resulting in either a solder ring or a ring of solderable metal 69. Also a conductive interconnection layer 63 is applied to the wafer 62. Next, the individual glass covers are obtained by dicing of the glass wafer (FIG. 6B). The resulting glass dies are slightly larger than the seal ring pattern 69 and smaller than the interconnect pattern 63.

The next step in the fabrication process of the HISBGA is the assembly of the glass cover 61 on the semiconductor wafer 62. The technique used for this process is based on the fluxless soldering of the sealing ring 69 on the glass cover 61 to the sealing ring 69 on the die thereby forming a clean hermetic cavity between the glass or transparent cover 61 and the optically active area of the die. This sequence is shown schematically in FIG. 6C.

After the above process steps of preparing the semiconductor substrate and the transparent substrate and the bonding of both substrates, the wafer is diced (FIG. 6D).

Figure 6E:
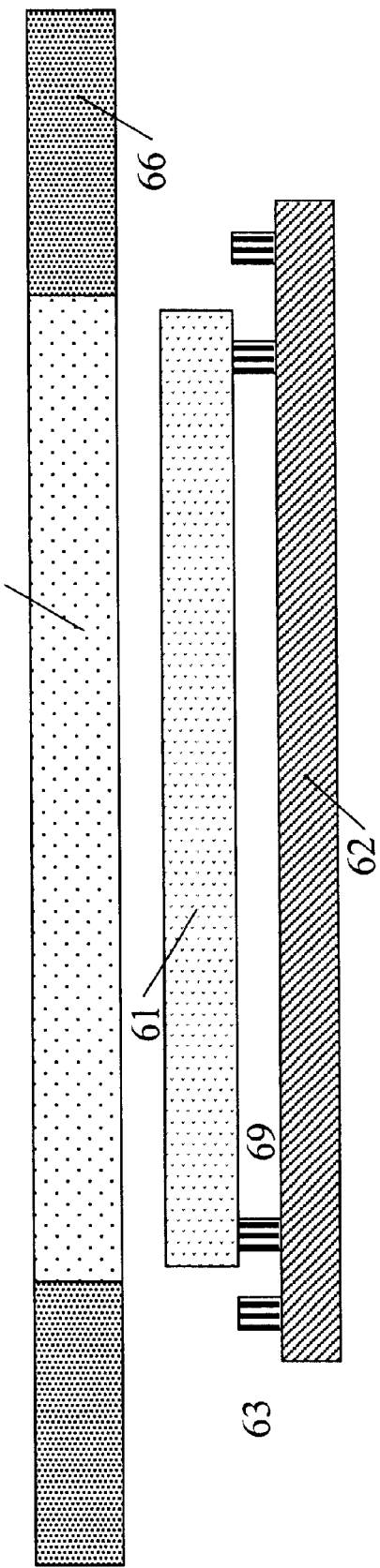
FIG. 6: Schematic representation of the semiconductor substrate (62) and transparent wafer (61) processing and BGA assembly of the chip with hermetic glass seal (69) using flip chip bonding technology and epoxy underfill (65), according to one embodiment of the invention is shown

The packaging sequence comprises the following packaging steps: Flip chip attaching the die 61/62 to a BGA substrate 66. In this case, the BGA carrier contains a window 613, which fits the transparent cover of the CMOS die or the imaging device. The interconnection pattern 63 is attached to the BGA substrate 66 (FIGS. 6E, F). Depositing a polymeric (insulating) underfill 65 to encapsulate the flip chip connections 63 up to the solder sealing ring 69 and also filling in the gap between the glass cover 61 and the BGA substrate 66 (FIG. 6G). Attaching solder balls 67 to the BGA substrate 66 (FIG. 6H) followed by BGA substrate singulation.

In the latter embodiment the total thickness of the packaged structure is less than in the wire bonding approach of the previous embodiment. Hence, the total thickness of the packaged device depends on the approach chosen.

Further according to the first aspect of the present invention, apart from the BGA-style image sensor packages as previously described a further packaging method is included within the scope of the invention. Two embodiments are shown, the first one with direct ball attach to the glass window (FIG. 7), the second one using an inter-poser ring in order to reduce the stresses caused by the thermo-mechanical mismatch between the package and the board (FIG. 8). In order to realize this package, a similar process is used as for the realization of the hermetically sealed ISBGA with flip chip solder connection as described above. The main difference is however that a glass window 71, slightly larger than the die or imaging device is used and that an interconnect pattern 73 is defined on the glass wafer 71. The transparent substrate 71 fulfills the function of the BGA substrate in the HISGBA as shown in FIG. 6H, illustrating another embodiment of this invention.

Figure 6F:
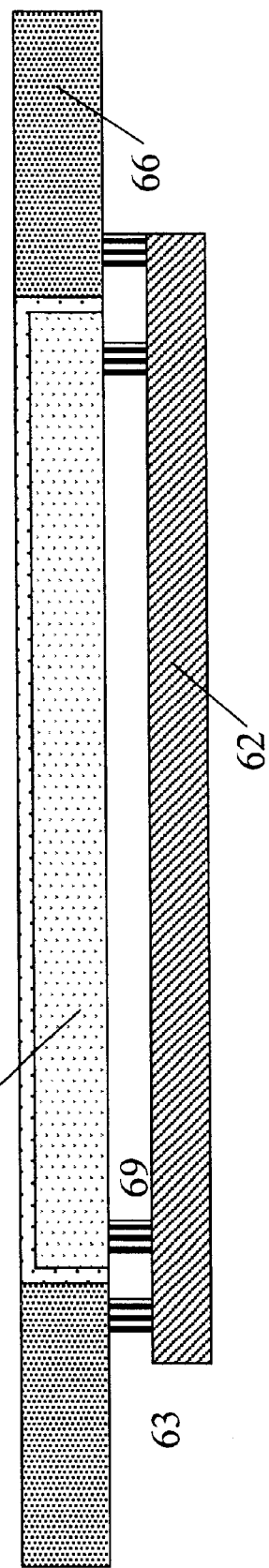

Apart from some minor differences the post-processing of the imager wafer and the glass window wafer is identical to the methods as previously described with respect to FIG. 4 and 6. Singulated dies 72 are attached to a glass wafer or transparent substrate 71 instead of individual glass covers being attached to a semiconductor substrate. The conductive pattern on the glass wafer is slightly more complex than in the latter case, requiring one additional mask layer. This pattern includes, apart from the solder ring 79 used for the hermetic sealing, also pads for the chip-I/O connections 73 in the flip-chip connection and connecting lines 78 to pads for the attachment of the interposer frame 86 or BGA solder ball 77, 87 attachment.

The interposer 86 can consist of a laminate based frame material with electrical connections from the top to the bottom. The interposer 86 could be in a strip format with multiple devices on a single strip. In order to avoid soldering problems, a local solder mask is needed on the glass wafer. This local solder mask may be applied by spincoating and standard photo-lithography techniques.

The package assembly steps comprises the following steps:

Preparation of a glass substrate 71; 81 as a window with conductive patterns 79, 73, 78; 89, 83, 88 and preparation of a semiconductive substrate 72; 82 with an optical device therein and corresponding conductive patterns 79, 73; 89, 83 (FIGS. 7A, 8A). Flip chip attachment of the singulated imager 72; 82 die to the glass window 71; 81, using e.g. the fluxless indent reflow technique to provide wiring connections 83 and metallic hermetic seal 79, 89 (FIGS. 7B, 8B).

Underfilling with a polymeric material 75, 85 such as epoxy in the gap between the die and the glass window (FIGS. 7C, 8C).

Figure 7D:
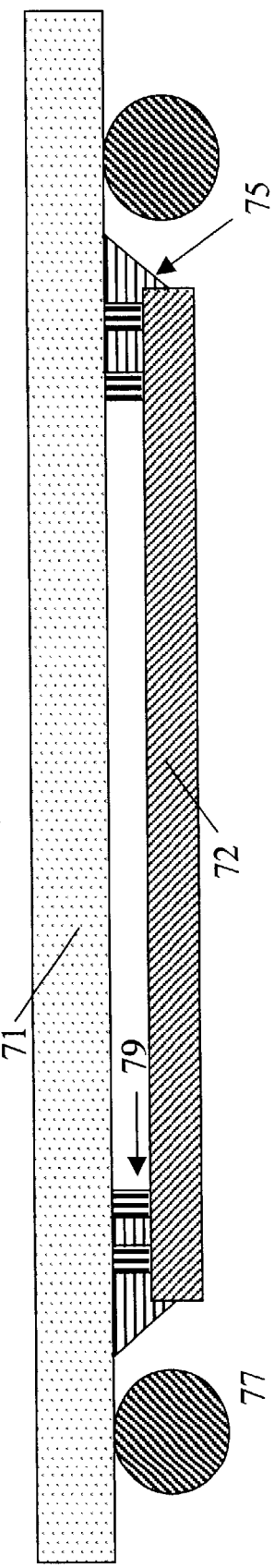
FIG. 7: Schematic representation of the semiconductor substrate (72) and transparent substrate (71) processing and assembling in case of a "wafer level" HISBGA, showing the glass window (71) directly attached on the CMOS chip using a solder ring (79), resulting in a hermetic sealing. The solder balls (77) of the flip chip bonding are directly attached to the transparent substrate (71).

In case no interposer is used (see FIGS. 7A–E):

Solder ball 77 attachment to the glass substrate 71 (FIG. 7D)

Figure 7E:
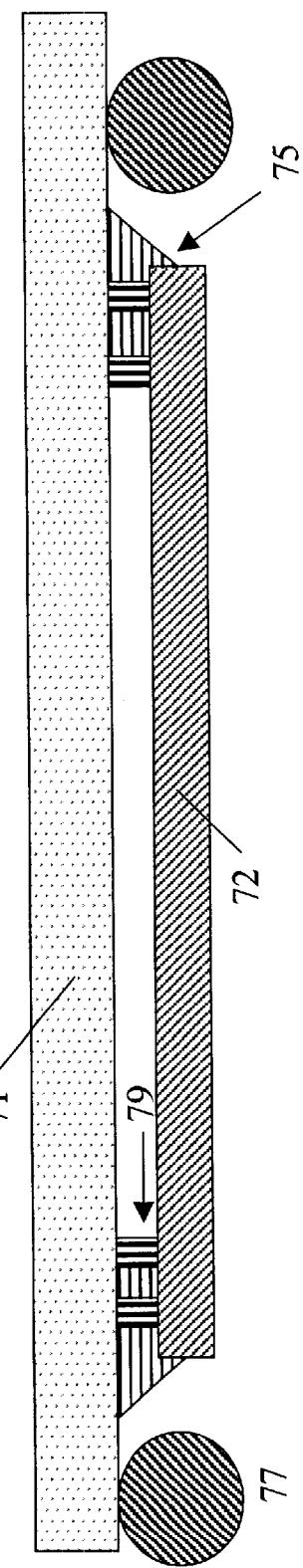

Singulation of the glass wafer with attached balls and die (FIG. 7E)

In case an interposer is used (FIGS. 8A–F):

Dicing of the glass wafer with attached die (FIG. 8B)

Screen printing solder onto pads 88 on the frame-shaped interposer 86 (FIG. 8C)

Place die and window onto interposer frame 86 and reflow the solder paste (FIG. 8D).

Attach solder balls 87 to the inter-poser frame 86 (FIG. 8E)

Singulation of the inter-poser strip 86 (FIG. 8F)

Figure 9:
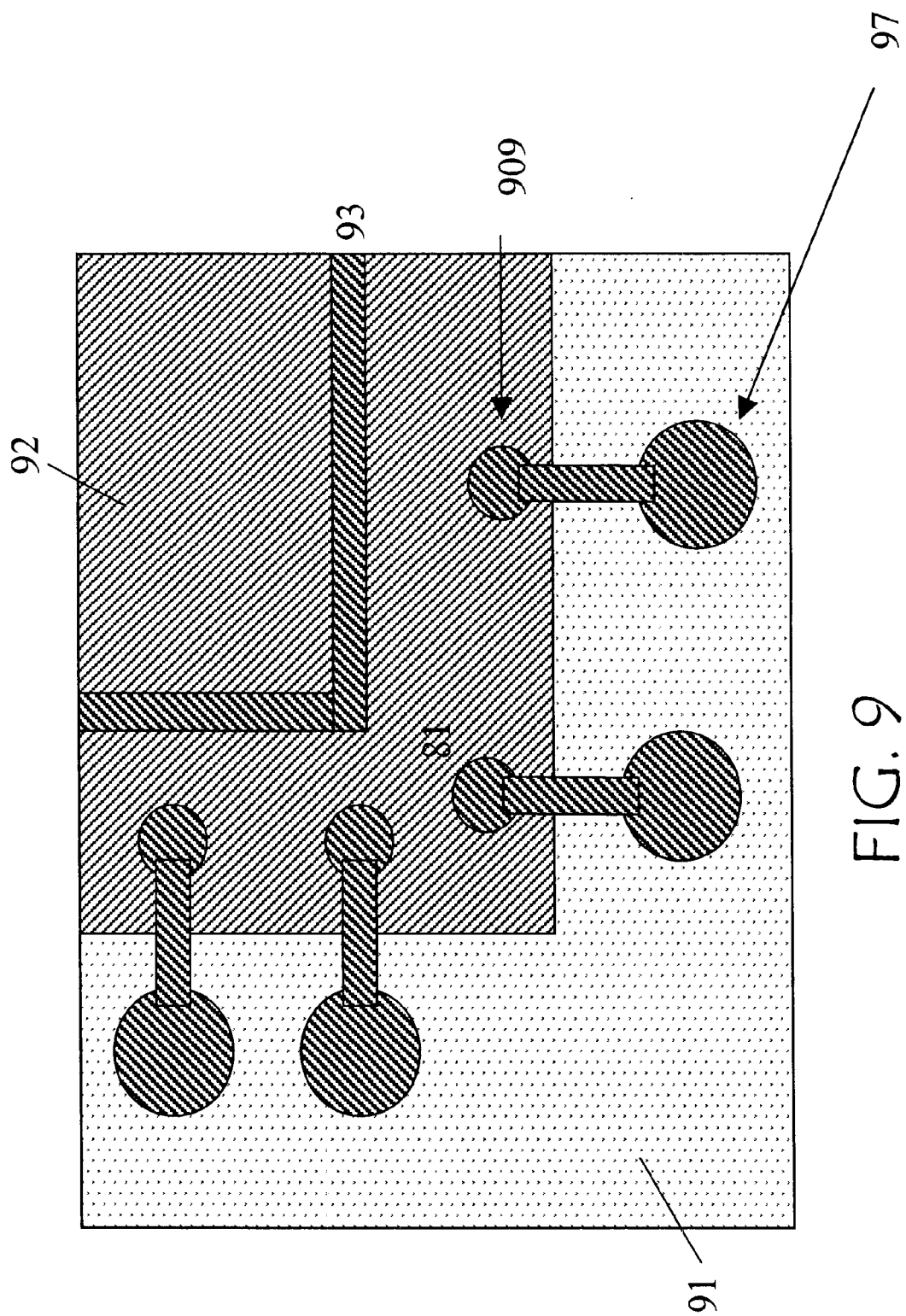
FIG. 9: Schematic view of the corner of the package resulting from the processing shown in FIG. 7, as seen through the transparent substrate (91). Shown are the semiconductor substrate (92), the sealing ring (93), the flip chip connection pads (909) and the BGA solder ball connections (97).

A schematic drawing of the corner of a package as processed according to the embodiment of FIG. 7, seen through the glass window is shown in FIG. 9.

In a second aspect of the invention an Image Sensor Ball Grid Array (ISGBA) is presented having the light sensitive part of the imager non-hermetically sealed from the environment. These non-hermetically sealed ISBGA's are further referred to as NHISBGA's. The sealing is performed using polymer materials, therefore not resulting in a true hermetic sealing as is the case for the HISGBA in the first aspect of the invention, but this polymer sealing offers a reliability at least similar to standard plastic packaged components. The NHISBGA's are therefore produced in a very cost effective way. These BGA packages have to be adapted to include the transparent cover to transmit light to the sensor and to provide a barrier around the optical sensitive area preventing e.g. diffusion of epoxy in between the image sensor and the transparent cover. The distance between the image sensor and the transparent cover has to be controlled.

The NHISBGA comprises a structure having a cavity (FIG. 3), wherein said cavity is defined by walls 35 between a first substrate 32 and a second substrate 31, said second substrate being transparent, said walls 35 being a layer or a stack of layers comprising at least a dam, e.g. a polymeric dam such as epoxy. The walls 35 are located around at least one optical sensitive area formed on said first substrate 32. The NHISBGA further comprises, optionally a third substrate 36, for instance a BGA substrate, said third substrate 36 being attached to said structure.

The starting point for the construction of this package can be a standard silicon imaging device and a glass-sealing lid of approximately the same size. A schematic overview of the packaging procedure is shown in FIG. 10. The assembly procedure compromises the steps of:

Die attaching of an imaging device 102 on a standard BGA substrate 106. On the corners of this BGA substrate a spacer 1011 may be optionally attached in order to accurately control the final height between the glass window (to be applied) and the chip. (FIG. 10A, only showing a spacer 1011 at one side)

Wire bonding 104 of the I/O connections from the chip 102 to the BGA substrate 106 (FIG. 10B)

Deposition of a dam 1012, e.g. epoxy, on the imaging device 102, close to the inside of the wire bonds 104. This dam layer 1012 may also carry out the function of the spacer 1011 as an alternative to the spacers 1011 on the BGA substrate 106, so that the latter spacer 1011 can be left out. (FIG. 10C). This epoxy dam 1012 prevents the optical sensing area from being covered with polymeric sealant during the glob top deposition step.

Glob top deposition 105 all over the wire bonds with a polymeric sealant such as epoxy. (FIG. 10D) but without curing completely.

Attachment of the glass chip or transparent cover 101 on the uncured glob top epoxy layer and curing of the epoxy layer (FIG. 10E)

Figure 10F:
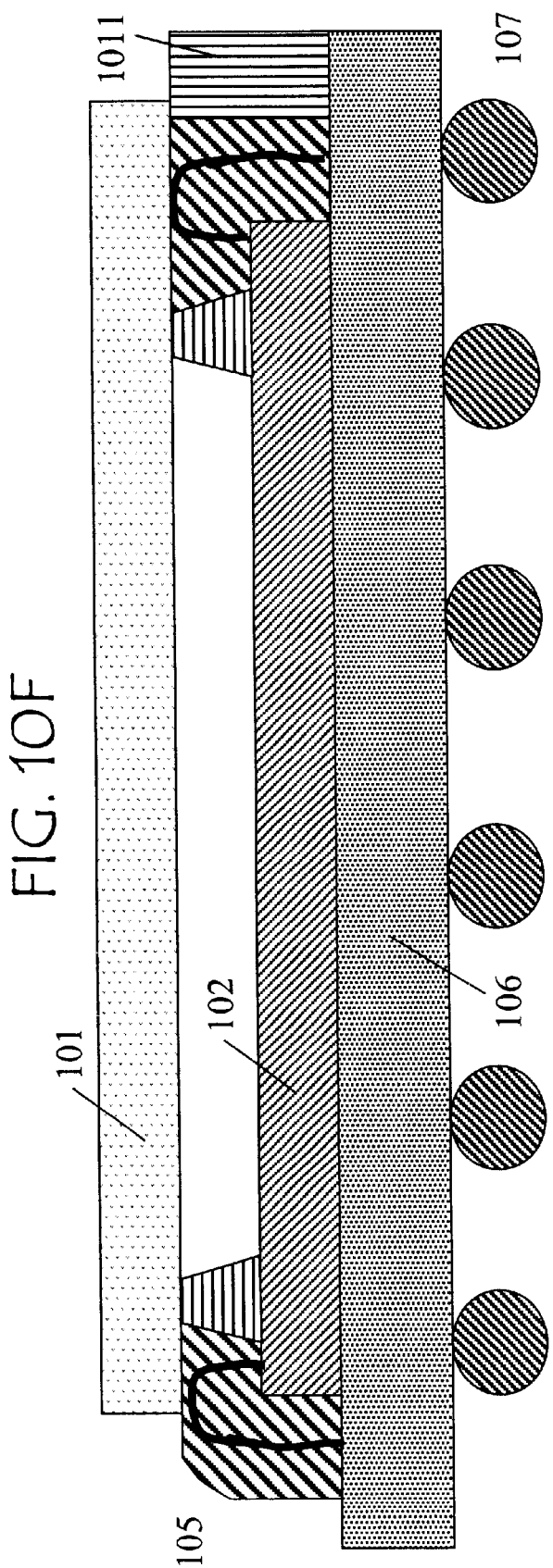
FIG. 10: Non-hermetic BGA assembly of the chip (102) and glass seal (101) using wire bonding (104) technology and glob top encapsulation (105). The right side also shows a spacer (1011) between the transparent (101) and the BGA substrate (106), aaccording to one embodiment of the invention is shown.

Attaching solder balls 107 to the BGA substrate (FIG. 10F)

BGA substrate singulation

According to the second aspect of the present invention, another novel package build-up for optically sensitive dies is included within the present invention. In this approach, a window chip, transparent to the radiation detected by the chip, is glued to the optically active area of the chip. This process of attaching glass windows to the die can be applied at wafer level. After the attachment of the window or transparent cover to the die, the wafer is diced and the composite chips are mounted on a standard BGA carrier. The chip is connected by wire bonding which are protected using a glob-top encapsulant. A schematic drawing of a cross-section through a proposed ISBGA package is shown in FIG. 11.

The main advantages of this package are:

A constant, well-controlled thickness between the chip surface and the glass window A cavity between the die and the window is no longer required, resulting in a more cost effective and more reliable package The dielectric material between the window and the chip acts as an optical glue layer, reducing problems with internal reflections inside the package.

The presence of the optical glue layer, which has a well-defined thickness, also avoids the occurrence of Newton-ring effects between the glass and the die.

Figure 12:
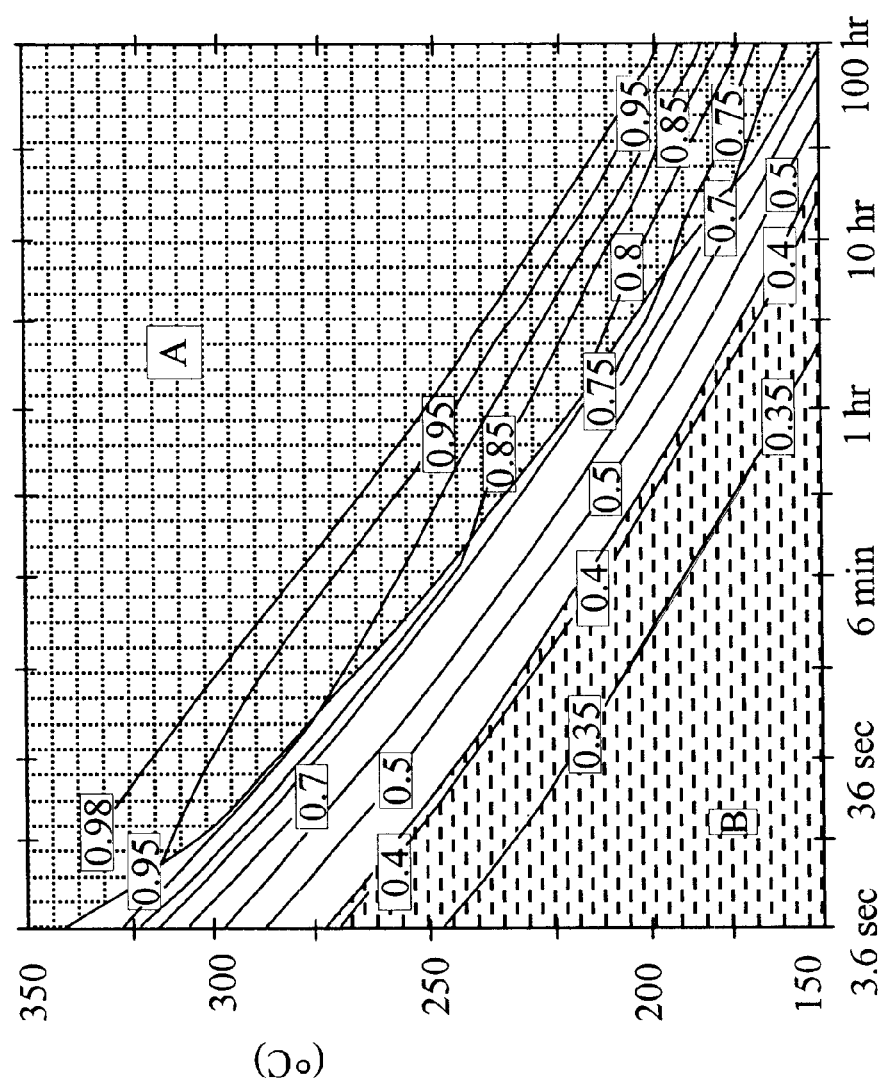
FIG. 12: Cure Kinetics for BCB cyclotone 3022: Temperature (°C.) versus Time (sec, min, hr) (a) liquid phase, (b) solid phase

A preferred process sequence for realizing this ISBGA package with an optical glue layer is described below. For the construction of this package, use is made of an optical glue layer that preferably has the following properties:

- Applicable in thin uniform layers on glass and semiconductor silicon wafers, e.g. by spin-coating.
- Curing to a stable form, without formation of large amounts of reaction products, e.g. in gaseous form. If present, these reaction products might cause the glass cover to delaminate from the die.
- Good thermal and chemical compatibility with the chip coating materials, such as various types of color filters. This requires low processing temperatures.
- Easy patterning to open wafer scribe lines and wire bond pads. This implies that the material is photo-sensitive or that it may easily be removed by e.g. laser etching.
- A preferred optical glue material is BenzoCycloButene (BCB) from Dow Chemical, USA. FIG. 12 describes the cure kinetics of this material. The process sequence is split into four parts: 1) the preparation and singulation of the glass window die; 2) the attachment process of these window die on the active silicon wafer or semiconductor substrate; 3) the dicing of the composite wafer, 4) finally the BGA-style assembly of the composite die.

Preparation and Singulation of the Glass Window Die

Figure 11A:
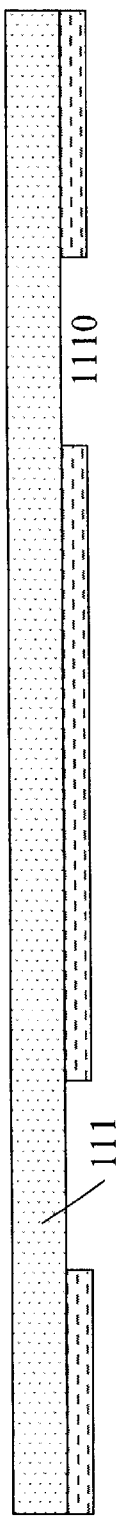
FIG. 11: Schematic cross-section of an ISBGA, showing the glass window (111) directly attached on the CMOS chip (112) using an optical glue layer (1110). Wire bonding (114) is used for the interconnection to the BGA substrate (116).

A thin optical glue layer is spin coated on a transparent window substrate 111. This material can be e.g. photosensitive BCB from Dow Chemical. The thickness of this layer may be chosen between 1 and 20 micrometer. The thin film layer is photo-patterned, comprising illumination and exposure, forming a pattern of rectangular islands of thin BCB layers, separated by free dicing streets. (FIG. 11A)

This thin layer is kept in a dry state. Optionally it may be slightly cured to improve the stability of the film during dicing. The film should however not be fully cured as this would make adhesion to the substrate very difficult.

Figure 11B:
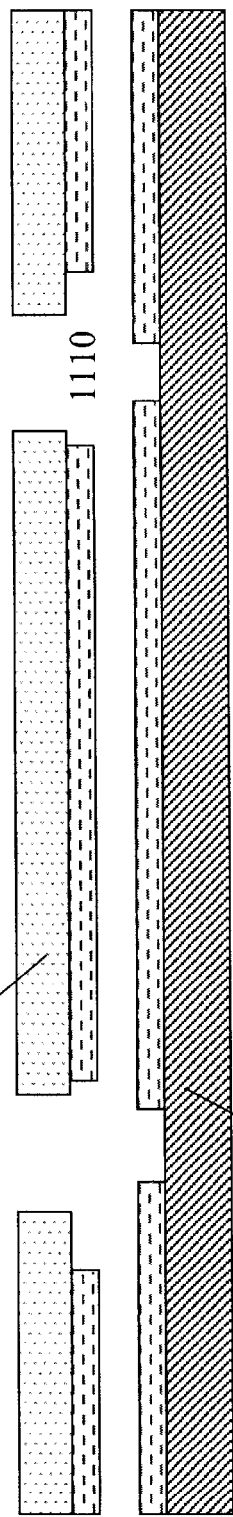
Figure 11C:
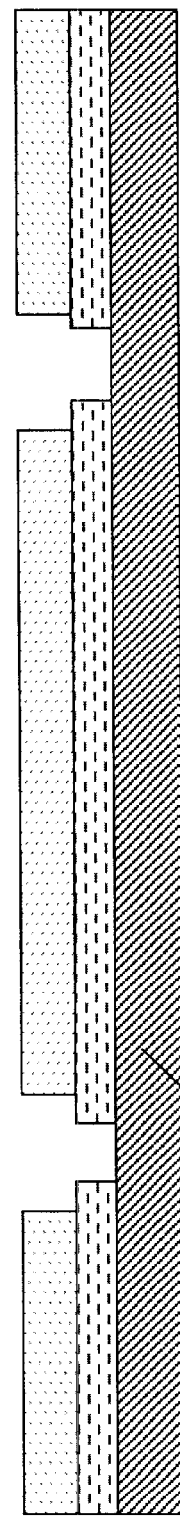

Dicing of the individual window chips or glass covers 111. Care must be taken to obtain clean side-walls and minimally sized dicing streets. (FIG. 11B)

Attachment of the Thinned Die on the Substrate

A thin optical glue layer 1110 is spin coated on an optically sensitive wafer 111. The preferred optical glue material can be again photosensitive BCB from Dow Chemical. The thickness of this layer may be chosen between 1 and 20 micrometer. (FIG. 11B)

The thin film layer is photo-patterned, comprising the steps of illumination, exposure and development, forming a pattern of rectangular islands of thin BCB layers 1110, covering the optically active chip areas. Any wire bond pads and the dicing streets are kept free of deposited materials. The size of the BCB film islands is to be slightly larger than that on the window chips to accommodate for any mounting tolerances. (FIG. 11B) The thin optical glue layer is kept in a dry state. Next, the window chips 111 are aligned and placed on the wafer 112 using a flip chip aligner/bonder tool. By applying a force and some heating to the window chip, the window chips are applied to the wafer with the image sensitive die. A temperature of about 150 C. and a force of 10–100N are sufficient to bond the die 112 to the substrate 111. (FIG. 11C) After placing all dies on the image wafer, the wafer is placed in a low temperature rapid thermal processing (RTP) system or in a vacuum oven. First a vacuum is applied to the system in order to remove all remaining gasses in the interface between the window 111 and the chip 112. By increasing the temperature above 200 C., the BCB layer 1110 will begin to cure and both BCB layers will inter link to finally become a single cross-linked BCB layer 1110. If the chip 112 can withstand temperatures of 275 C., the BCB layer could be cured in one or a few minutes. If the temperature stability of the wafer is lower, a final cure of the BCB layer in a box oven under nitrogen is required, e.g. 30 min to 1 hour at 210 to 260 C. (see FIG. 12 for curing kinetics BCB).

Figure 11D:
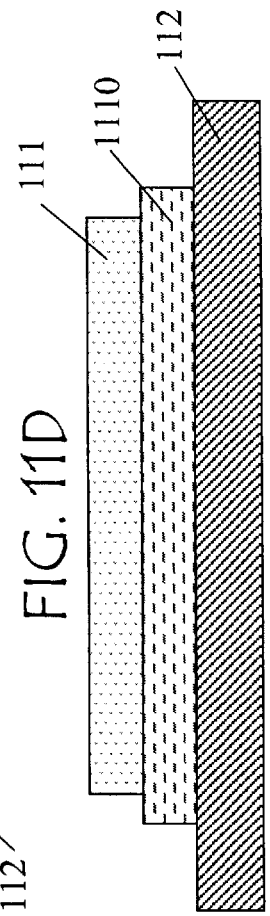
Figures 11E, 11F, 11G:
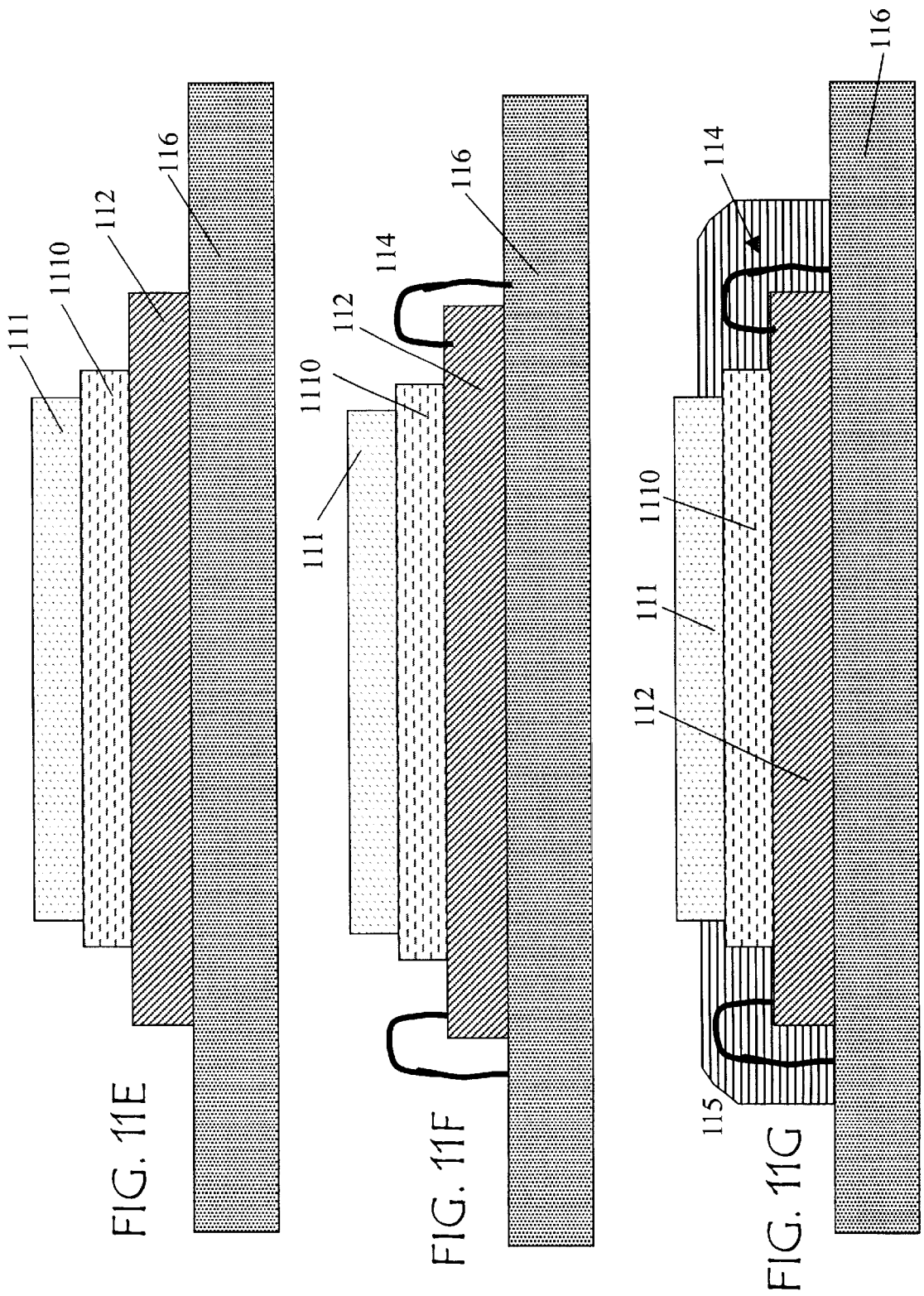
Figure 11H:
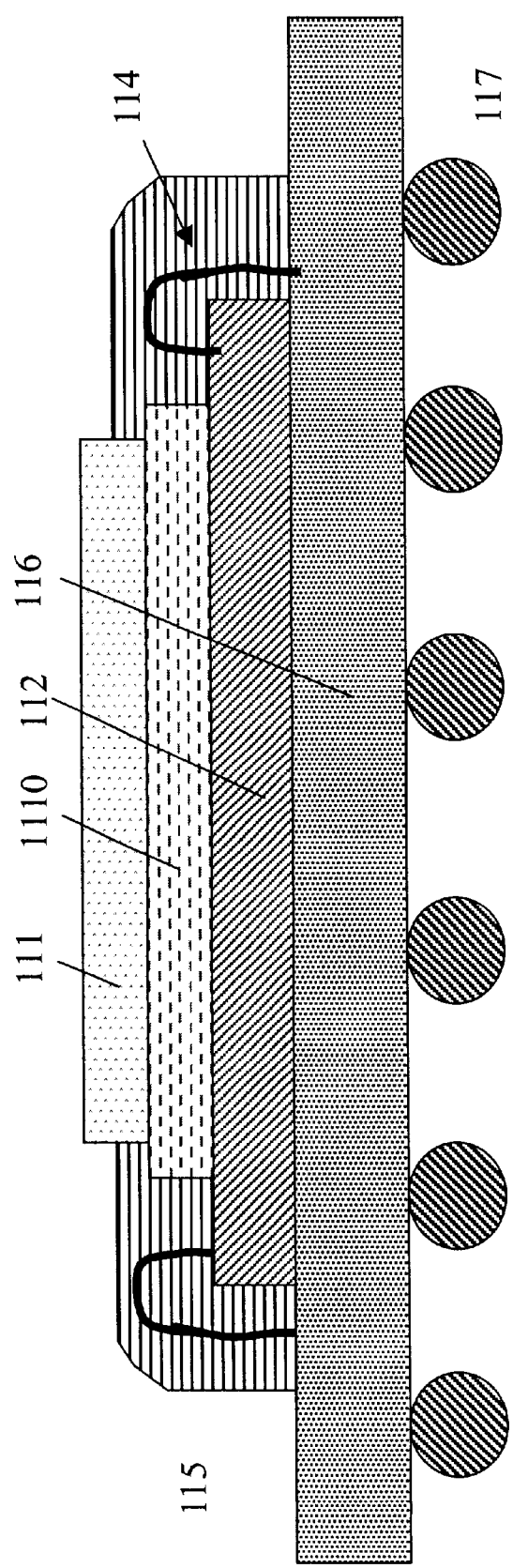

After these process steps, the "composite" wafer is diced into individual components using standard wafer dicing procedures. (FIG. 11D)

The individual dies are now packaged in a "standard" BGA-style. The different steps are (see FIG. 11):

- Die attach of the stack of transparent covers 111 glued on the imaging device 112, on the BGA substrate 116 (FIG. 11E)
- Wire bonding 114 of the I/O connections from the chip 112 to the BGA substrate 116. (FIG. 11F)
- Deposition of a polymeric sealant 115, e.g. glob top deposition of epoxy completely over the wire bonds (FIG. 11G)
- Attach solder balls 117 to the BGA substrate 116 (FIG. 11 H), followed by BGA substrate singulation.

What is claimed is:

1. A Hermetically Sealed Ball Grid Array device, comprising:
   - an assembly having a sealed cavity,
   - wherein said cavity is defined by walls according to a closed geometric configuration between a first substrate and a second substrate;
   - solder balls attached to said second substrate;
   - said second substrate being transparent and larger than said first substrate;
   - said first substrate being a semiconductor substrate containing at least one optically sensitive area;
   - said walls comprising a metal seal between the first and second substrate and said walls surrounding said at least one optically sensitive area; and
   - said assembly being flip chip connected to a third substrate.

2. A device as recited in claim 1, wherein the metal seal comprises a stack of layers including at least a first metallization layer, a reflowed solder layer, and a second metallization layer.

3. A device as recited in claim 1, further comprising an interposer frame attached to said second substrate; and
   - wherein said solder balls are attached to second substrate via said interposer frame.

4. A device as recited in claim 3 wherein said interposer frame comprises a laminate based frame with electrical connections.

5. A device as recited in claim 1 wherein said second substrate comprises at least one optical coating layer.

6. A device as recited in claim 1 wherein said second substrate is glass.

7. A Hermetically Sealed Ball Grid Array device, comprising:
   - an assembly having a sealed cavity,
   - wherein said cavity is defined by walls according to a closed geometric configuration between a first substrate and a second substrate;
   - said second substrate being transparent and larger than said first substrate;

said first substrate being a semiconductor substrate containing at least one optically sensitive area;

said walls comprising a metal seal between the first and second substrate and said walls surrounding said at least one optically sensitive area;

said assembly being flip chip connected to a third substrate, and said first substrate being electrically connected to said second substrate using flip chip bonding.

8. A device as recited in claim 7, wherein the metal seal comprises a stack of layers including at least a first metallizationa layer, a reflowed solder layer, and a second metallization layer.

9. A device as recited in claim 7, further comprising:
an interposer frame attached to said second substrate; and
solder balls attached to said interposer frame.

10. A device as recited in claim 9 wherein said interposer frame comprises a laminate based frame with electrical connections.

11. A device as recited in claim 7 further comprising solder balls attached to said second substrate.

12. A device as recited in claim 7 wherein said second substrate comprises at least one optical coating layer.

13. A device as recited in claim 7 wherein said second substrate is glass.

* * * * *